US010790305B2

(12) United States Patent
Do et al.

(10) Patent No.: US 10,790,305 B2
(45) Date of Patent: Sep. 29, 2020

(54) INTEGRATED CIRCUIT INCLUDING CLUBFOOT STRUCTURE CONDUCTIVE PATTERNS

(71) Applicant: Samsung Electronics Co., Ltd., Suwon-si, Gyeonggi-do (KR)

(72) Inventors: Jung-ho Do, Hwaseong-si (KR); Ji-Su Yu, Seoul (KR); Hyeon-gyu You, Wanju-gun (KR); Seung-Young Lee, Seoul (KR); Jae-Boong Lee, Yongin-si (KR); Jong-Hoon Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/409,129

(22) Filed: May 10, 2019

(65) Prior Publication Data
US 2019/0355750 A1    Nov. 21, 2019

(30) Foreign Application Priority Data
May 21, 2018    (KR) .................. 10-2018-0057989

(51) Int. Cl.
*H01L 23/52* (2006.01)
*H01L 27/118* (2006.01)
*H01L 27/02* (2006.01)

(52) U.S. Cl.
CPC .... *H01L 27/11807* (2013.01); *H01L 27/0207* (2013.01); *H01L 2027/11862* (2013.01); *H01L 2027/11866* (2013.01); *H01L 2027/11887* (2013.01)

(58) Field of Classification Search
CPC ............. H01L 27/0207; H01L 27/0928; H01L 27/11807; H01L 27/11898; H01L 29/94
USPC .......................................................... 257/211
See application file for complete search history.

(56) References Cited

U.S. PATENT DOCUMENTS

| 7,492,013 | B2 | 2/2009 | Correale, Jr. |
| 7,888,705 | B2 | 2/2011 | Becker et al. |
| 7,934,189 | B2 | 4/2011 | Melzner et al. |
| 8,357,955 | B2 | 1/2013 | Tanaka |
| 8,881,083 | B1 | 11/2014 | Deng et al. |
| 9,098,668 | B2 | 8/2015 | Tien et al. |
| 9,397,083 | B2 | 7/2016 | Shimizu |
| 2012/0168875 | A1* | 7/2012 | Tamaru ............... H01L 27/0928 257/390 |

(Continued)

*Primary Examiner* — Brook Kebede
(74) *Attorney, Agent, or Firm* — Harness, Dickey & Pierce, P.L.C.

(57) ABSTRACT

An integrated circuit includes a standard cell. The standard cell may include a plurality of gate lines and a plurality of first wirings. The plurality of first wirings may include a clubfoot structure conductive pattern that includes a first conductive pattern and a second conductive pattern spaced apart from each other. Each of the first conductive pattern and the second conductive pattern may include a first line pattern extending in a first direction and a second line pattern protruding from one end of the first line pattern in a direction perpendicular to the first direction. The plurality of gate lines may be spaced apart from each other by a first pitch in the first direction, and the plurality of second wirings may be spaced apart from each other by a second pitch in the first direction. The first pitch may be greater than the second pitch.

20 Claims, 13 Drawing Sheets

(56) References Cited

U.S. PATENT DOCUMENTS

| | | |
|---|---|---|
| 2014/0327050 A1 | 11/2014 | Hsieh et al. |
| 2017/0255739 A1 | 9/2017 | Hsieh et al. |
| 2017/0294430 A1 | 10/2017 | Seo et al. |
| 2019/0393205 A1* | 12/2019 | Lee ........................ G06F 30/392 |

* cited by examiner

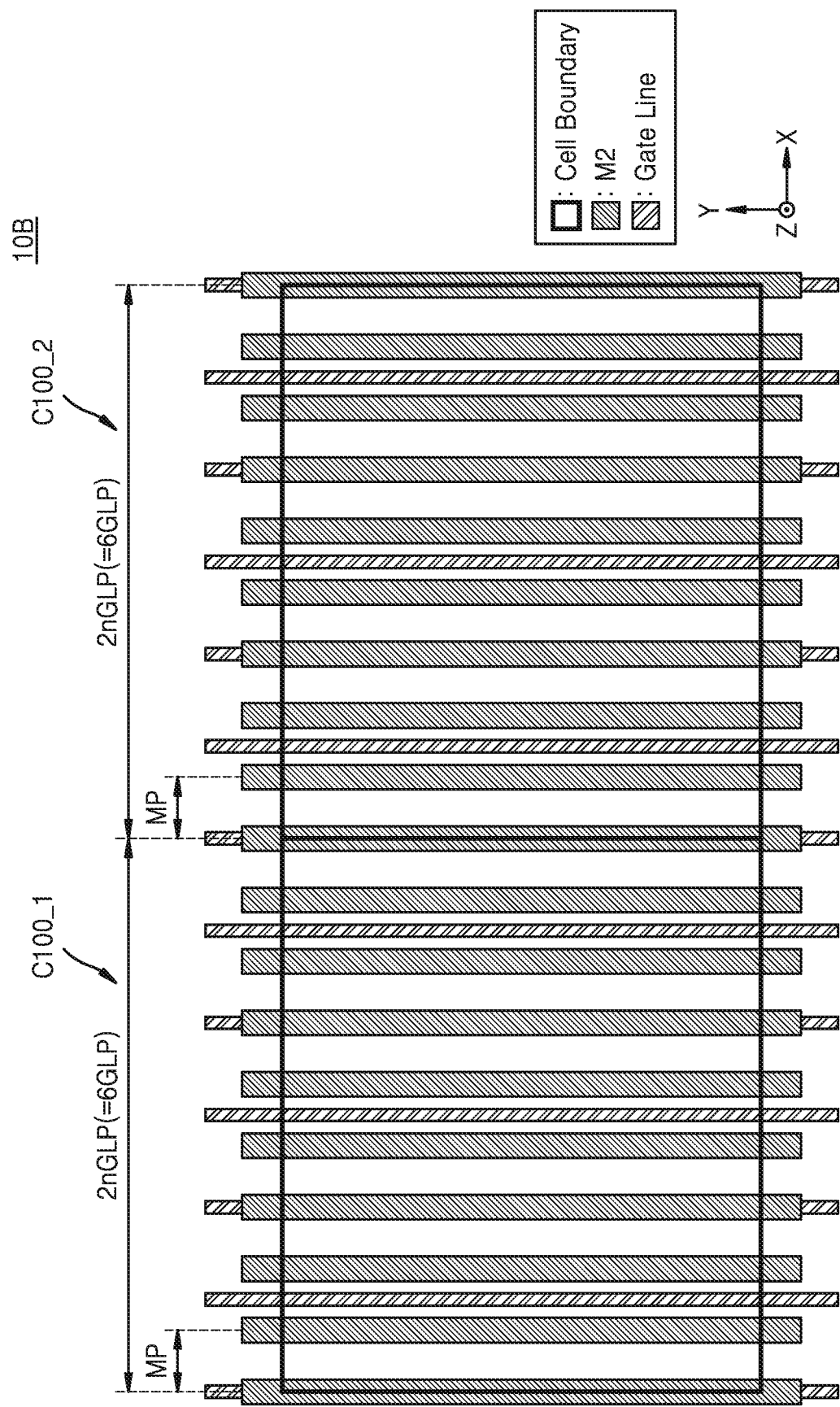

INTEGRATED CIRCUIT INCLUDING CLUBFOOT STRUCTURE CONDUCTIVE PATTERNS

CROSS-REFERENCE TO RELATED APPLICATION

This application claims the benefit of Korean Patent Application No. 10-2018-0057989, filed on May 21, 2018, in the Korean Intellectual Property Office, the disclosure of which is incorporated herein in its entirety by reference.

BACKGROUND

Inventive concepts relate to an integrated circuit, and more particularly, to an integrated circuit including clubfoot structure conductive patterns.

As a configuration of integrated circuits becomes more complicated and a semiconductor manufacturing process becomes more miniaturized, a large number of semiconductor elements may be integrated into the integrated circuits. Widths of wirings may be required to be decreased to efficiently arrange the wirings for interconnecting the semiconductor elements. In addition, as the widths of the wirings decrease, an efficient configuration for connecting the semiconductor elements to the wirings may be required.

SUMMARY

Inventive concepts provide an integrated circuit including clubfoot structure conductive patterns to reduce the complexity of wirings, and a computing system for designing the integrated circuit.

According to an aspect of inventive concepts, an integrated circuit may include a standard cell defined by a cell boundary and a plurality of second wirings on a upper layer of the standard cell. The standard cell may include a plurality of gate lines spaced apart from each other in a first direction and extending in a second direction perpendicular to the first direction, and a plurality of first wirings on a upper layer of the plurality of gate lines and including a clubfoot structure conductive pattern. The clubfoot structure conductive pattern may include a first conductive pattern and a second conductive pattern spaced apart from each other. Each of the first conductive pattern and the second conductive pattern may include a first line pattern extending in the first direction and a second line pattern protruding from one end of the first line pattern in a direction perpendicular to the first direction. The plurality of gate lines may be spaced apart from each other by a first pitch in the first direction. The plurality of second wirings may extend in the second direction. The plurality of second wirings may be spaced apart from each other by a second pitch in the first direction. The first pitch may be greater than the second pitch.

According to another aspect of inventive concepts, an integrated circuit may include a standard cell and a plurality of wirings on a upper layer of the standard cell. The standard cell may include a first gate line, a second gate line, a clubfoot structure conductive pattern, a plurality of first vias, and a plurality of second vias. The first gate line and the second gate line may be spaced apart from each other in a first direction and may extend in a second direction perpendicular to the first direction. The clubfoot structure conductive pattern may include a first conductive pattern and a second conductive pattern symmetrical to each other. The first conductive pattern may be on an upper layer of the first gate line and the second conductive pattern may be on an upper layer of the second gate line. Each of the first conductive pattern and the second conductive pattern may include a first line pattern extending in the first direction and a second line pattern protruding in a direction perpendicular to the first direction from one end of the first line pattern. The plurality of first vias may be configured to electrically connect the first gate line to the first conductive pattern and to electrically connect the second gate line to the second conductive pattern. The plurality of second vias may be configured to electrically to the clubfoot structure conductive pattern. The plurality of wirings may be spaced apart from each other in the first direction and may extend in the second direction. The plurality of wirings may be configured to connect to the clubfoot structure conductive pattern through the plurality of second vias.

According to another aspect of inventive concepts, an integrated circuit may include a plurality of standard cells and a plurality of wirings. The plurality of standard cells may include a first standard cell and a second standard cell that each include a plurality of gate lines. The plurality of gate lines may be spaced apart from each other by a first pitch in a first direction and may extend in a second direction perpendicular to the first direction. At least one of the first standard cell or the second standard cell may include a clubfoot structure conductive pattern that includes a first conductive pattern and a second conductive pattern. Each of the first conductive pattern and the second conductive pattern may include a first line pattern extending in the first direction and a second line pattern protruding in a direction perpendicular to the first direction from one end of the first line pattern. The plurality of wirings may be on an upper layer of the first standard cell and on an upper layer of the second standard cell. The plurality of wirings may be spaced apart from each other by a second pitch in the first direction. The plurality of wiring may extend in the second direction perpendicular to the first direction. The second pitch may be less than the first pitch.

BRIEF DESCRIPTION OF THE DRAWINGS

Embodiments of inventive concepts will be more clearly understood from the following detailed description taken in conjunction with the accompanying drawings in which:

FIGS. 8A through 8D are schematic plan views respectively illustrating layouts of integrated circuits according to embodiments;

DETAILED DESCRIPTION OF EMBODIMENTS

Hereinafter, embodiments of inventive concepts will be described in detail with reference to the accompanying drawings.

Figure 1:
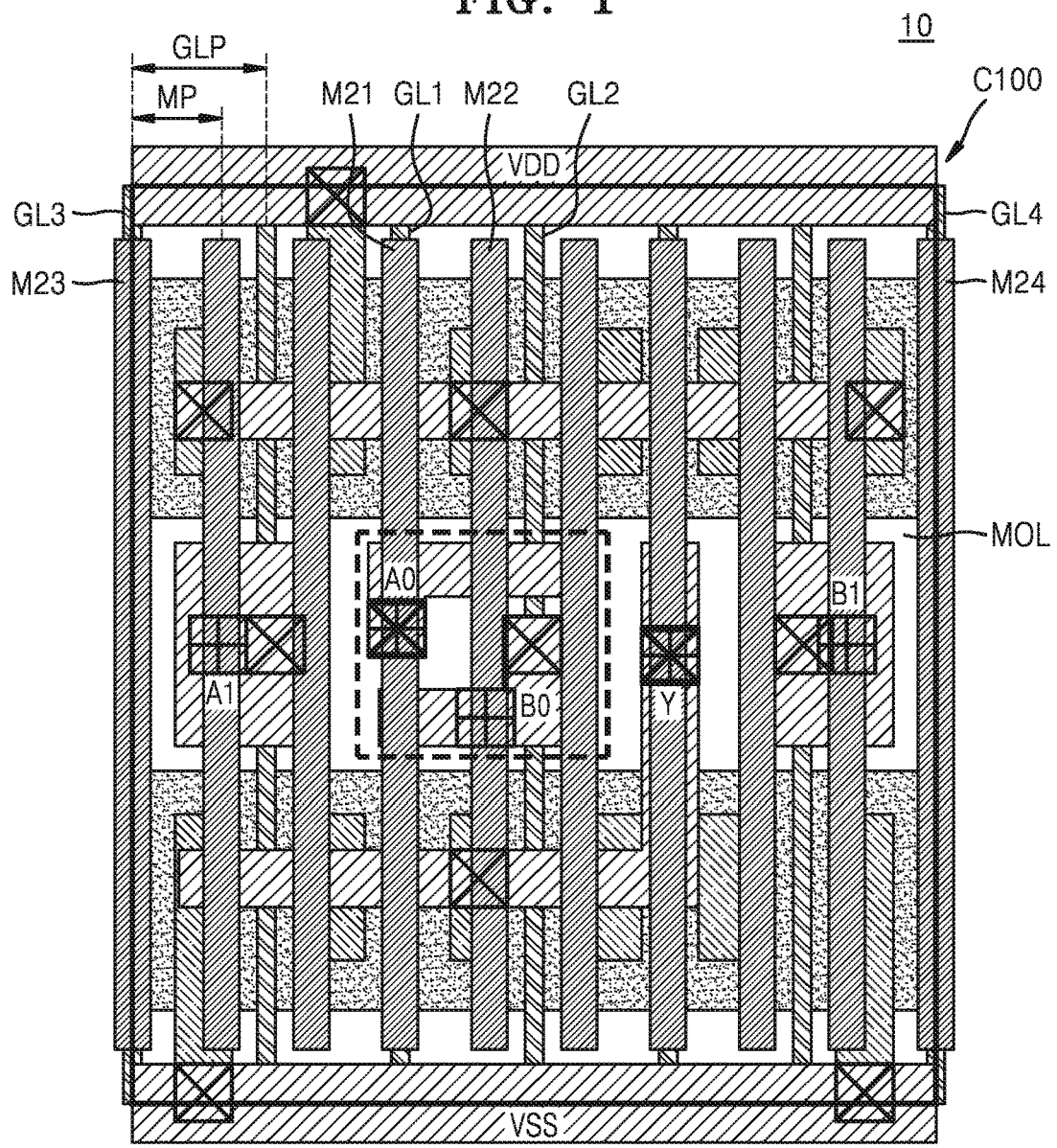
FIG. 1 is a plan view for schematically illustrating a layout of an integrated circuit according to an embodiment.

FIG. 1 is a plan view illustrating a layout of an integrated circuit 10 according to an embodiment. The plan view illustrates a plane formed in a first direction X and a second direction Y. A component arranged in a third direction Z relative to the other component may be referred to as being on or above the other component, and a component arranged in an opposite direction to the third direction Z relative to the other component may be referred to as being under the other component. In addition, among surfaces of the component, the surface in the third direction Z may be referred to as a top surface of the component, the surface in the opposite direction to the third direction Z may be referred to as a bottom surface of the component, and the surface in the first direction X or in the second direction Y may be referred to as a side surface of the component. In addition, in FIG. 1, even when some components are arranged on vias, the vias are illustrated for convenience of illustration.

Referring to FIG. 1, the integrated circuit 10 may include at least one standard cell C100 defined by a cell boundary. The standard cell C100 may include a plurality of input pins (A0, A1, B0, and B1) and an output pin Y. The number of input pins and output pins may vary depending on characteristics of a standard cell, and is not limited to those in FIG. 1.

The standard cell C100 may include a plurality of active regions extending in parallel in the first direction X. In one embodiment, a plurality of fins may be formed in each of the plurality of active regions. In one embodiment, the plurality of active regions may include a semiconductor such as silicon (Si) and germanium (Ge), or a combination thereof, or a compound semiconductor such as silicon germanium (SiGe), silicon carbide (SiC), gallium arsenide (GaAs), indium arsenide (InAs), and indium phosphide (InP). Also, the plurality of active regions may include a conductive region such as a well doped with impurities and a structure doped with impurities.

The standard cell C100 may include a plurality of gate lines (e.g., GL1 to GL4) extending in parallel in the second direction Y. The plurality of gate lines may be arranged in the plurality of active regions. The plurality of gate lines may form transistors with the plurality of active regions. Each of the plurality of gate lines may form a p-channel metal-oxide-semiconductor (PMOS) transistor with a portion of the plurality of active regions and, and each of the plurality of gate lines may form an n-channel metal-oxide-semiconductor (NMOS) transistor with the other portion of the plurality of active regions.

Each of the plurality of gate lines may be apart from each other by a certain pitch GLP in the first direction X. Some of the plurality of gate lines (for example, a third gate line GL3 and a fourth gate line GL4) may be arranged on the cell boundary of the standard cell C100 in the first direction X and on the cell boundary of the standard cell C100 in an opposite direction (−X) of the first direction X.

The plurality of gate lines may include a metal material such as tungsten (W) and tantalum (Ta), a nitride thereof, a silicide thereof, a doped polysilicon, etc.

The standard cell C100 may include a plurality of first wirings M1. The plurality of first wirings M1 may be arranged on an upper layer of the plurality of gate lines. The plurality of first wirings M1 may be connected to the plurality of active regions or the plurality of gate lines via contacts and first vias V0. The plurality of first wirings M1 may include a portion thereof extending in the first direction X and may include a portion thereof extending in the second direction Y.

In one embodiment, the plurality of first wirings M1 may include a clubfoot structure conductive pattern. The integrated circuit 10 including the standard cell C100 according to an embodiment may be configured to connect the plurality of gate lines (for example, a first gate line GL1 and a second gate line GL2) adjacent to each other and formed on a lower layer of the plurality of first wirings M1 to a plurality of second wirings M2 (for example, M21 and M22) adjacent to each other and formed on a upper layer of the plurality of first wirings M1, as the plurality of first wirings M1 include the clubfoot structure conductive pattern. A shape of the clubfoot structure conductive pattern will be described later with reference to FIG. 3.

In one embodiment, a pitch between the plurality of first wirings M1, except for a portion thereof in the clubfoot structure conductive pattern, may be substantially equal to the pitch GLP between the plurality of gate lines.

Power lines (VDD and VSS) for supplying power to the standard cell C100 may be respectively arranged on the cell boundary of the standard cell C100 in the second direction Y and on the cell boundary of the standard cell C100 in an opposite direction (−Y) to the second direction Y. The power lines (VDD and VSS) may extend in the first direction X. Although the power lines (VDD and VSS) are illustrated as being arranged on the cell boundary of the standard cell C100 in FIG. 1, inventive concepts are not limited thereto, and the power lines (VDD and VSS) may be arranged inside the standard cell C100 and the number of power lines (VDD and VSS) arranged inside the standard cell C100 may vary.

Although the plurality of first wirings M1 and the power lines (VDD and VSS) are illustrated and described as patterns on the same layer in FIG. 1, inventive concepts are not limited thereto, and in some embodiments, the power lines (VDD and VSS) may be formed on a wiring layer higher than the plurality of first wirings M1, for example, as a pattern on the same layer as the plurality of second wirings M2.

The integrated circuit 10 may further include the plurality of second wirings M2 for connecting the plurality of input pins (A0, A1, B0, and B1) of the standard cell C100 and the output pin Y to the outside. The plurality of second wirings M2 may be arranged on a layer higher than the plurality of first wirings M1 and may be formed to extend in the second direction Y in parallel with the plurality of gate lines. The plurality of second wirings M2 may be apart from each other by a certain pitch MP in the first direction X.

The standard cell C100 may further include a plurality of second vias V1 for connecting the plurality of second wirings M2 to the plurality of first wirings M1. In other words, the plurality of first vias V0 included in the standard cell C100 may be configured to connect the plurality of gate lines to the plurality of first wirings M1, and the plurality of second vias V1 may connect the plurality of first wirings M1 to the plurality of second wirings M2.

A portion (for example, M23 and M24) of the plurality of second wirings M2 may be arranged on the cell boundary of the standard cell C100. Thus, the portion (for example, M23 and M24) arranged on the cell boundary among the plurality of second wirings M2 may be aligned in the third direction Z with the third and fourth gate lines GL3 and GL4 each arranged on the cell boundary. In FIG. 1, the second wirings M2 (for example, M23 and M24) are illustrated as being arranged on the cell boundary in the opposite direction (−X) to the first direction X and on the cell boundary in the first direction X, but inventive concepts are not limited thereto. The second wiring M2 (for example, M23) may be arranged on the cell boundary in the opposite direction (−X) to the first direction X, but the second wiring M2 (for example, M24) may not be arranged on the cell boundary in the first direction X.

In one embodiment, the pitch MP between the plurality of second wirings M2 may be less than the pitch GLP between the plurality of gate lines. For example, a ratio of the pitch GLP between the plurality of gate lines to the pitch MP between the plurality of second wirings M2 may be about 3:2. Accordingly, the integrated circuit 10 including the standard cell C100 according to an embodiment may be configured to form more second wirings M2 per identical area compared with the case where the pitch MP between the plurality of second wirings M2 is equal to the pitch GLP between the plurality of gate lines and may increase a routing efficiency.

The plurality of first wirings M1 and the plurality of second wirings M2 may include a metal, a conductive metal nitride, a metal silicide, or a combination thereof. For example, the plurality of first wirings M1 and the plurality of second wirings M2 may include a conductive material such as W, molybdenum (Mo), titanium (Ti), cobalt (Co), Ta, nickel (Ni), tungsten silicide, titanium silicide, cobalt silicide, tantalum silicide, and nickel silicide.

Figure 2:
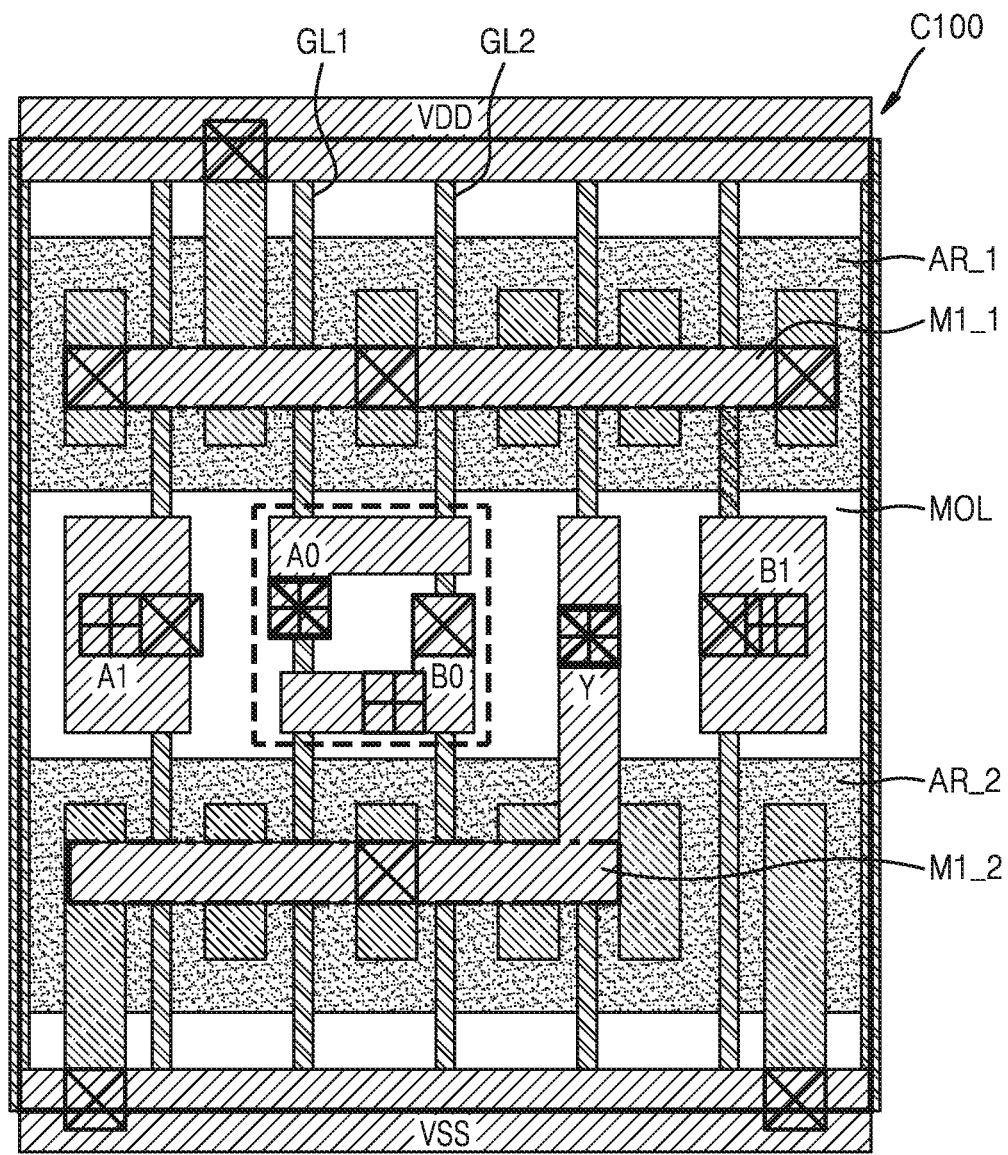
FIG. 2 is a plan view of a layout of a standard cell in FIG. 1, which explains an arrangement of a clubfoot structure conductive pattern.

FIG. 2 is a plan view of a layout of the standard cell C100 in FIG. 1, which explains an arrangement of the clubfoot structure conductive pattern.

Referring to FIG. 2, the standard cell C100 may include a first active region AR_1 and a second active region AR_2 which extend in parallel with each other in the first direction X. For example, the first active region AR_1 may be an active region for forming a PMOS transistor, and the second active region AR_2 may be an active region for forming an NMOS transistor.

In one embodiment, one of the plurality of first wirings M1 (for example, M1_1) extending in the first direction X may be arranged in the first active region AR_1 of the standard cell C100, and another one of the plurality of first wirings M1 (for example, M1_2) extending in the first direction X may be arranged in the second active region AR_2 of the standard cell C100. For example, the standard cell C100 may be a standard cell having a relatively small height in the second direction Y, or may be a standard cell having a low track structure in which widths of the first active region AR_1 and the second active region AR_2 in the second direction Y are relatively narrowly formed. Thus, the plurality of gate lines and the second wirings M2 may be efficiently connected by including the clubfoot structure conductive pattern, and the routing efficiency may increase by reducing the pitch MP between the second wirings M2.

However, the standard cell C100 according to inventive concepts are not limited thereto, and the plurality of first wirings M1 extending in the first direction X may be formed in at least one active region of the first active region AR_1 and the second active region AR_2.

In one embodiment, the clubfoot structure conductive pattern may be arranged between the first active region AR_1 and the second active region AR_2. The clubfoot structure conductive pattern may be connected to the plurality of gate lines adjacent to each other via the first vias V0 and gate contacts.

Since the standard cell C100 according to inventive concepts includes the clubfoot structure conductive pattern, even when a space for forming the plurality of first wirings M1 is not sufficient due to a relatively small height in the second direction Y, the plurality of first wirings M1 may electrically connect the first and second gate lines GL1 and GL2 adjacent to each other and formed on the lower layer of the plurality of first wirings M1 to the plurality of second wirings M2 (for example, M21 and M22 in FIG. 1) adjacent to each other and formed on the upper layer of the plurality of first wirings M1. Particularly, even when at least portions of the plurality of second wirings M2 (for example, M21 and M22 in FIG. 1) and the first and second gate lines GL1 and GL2 are aligned with each other due to a difference between the pitch MP of the plurality of second wirings M2 (for example, M21 and M22 in FIG. 1) and the pitch GLP of the first and second gate lines GL1 and GL2, the plurality of second wirings M2 (for example, M21 and M22 in FIG. 1) and the first and second gate lines GL1 and GL2 may be electrically connected to each other via the clubfoot structure conductive pattern. A shape of the clubfoot structure conductive pattern will be described later with reference to FIG. 5.

Figure 3:
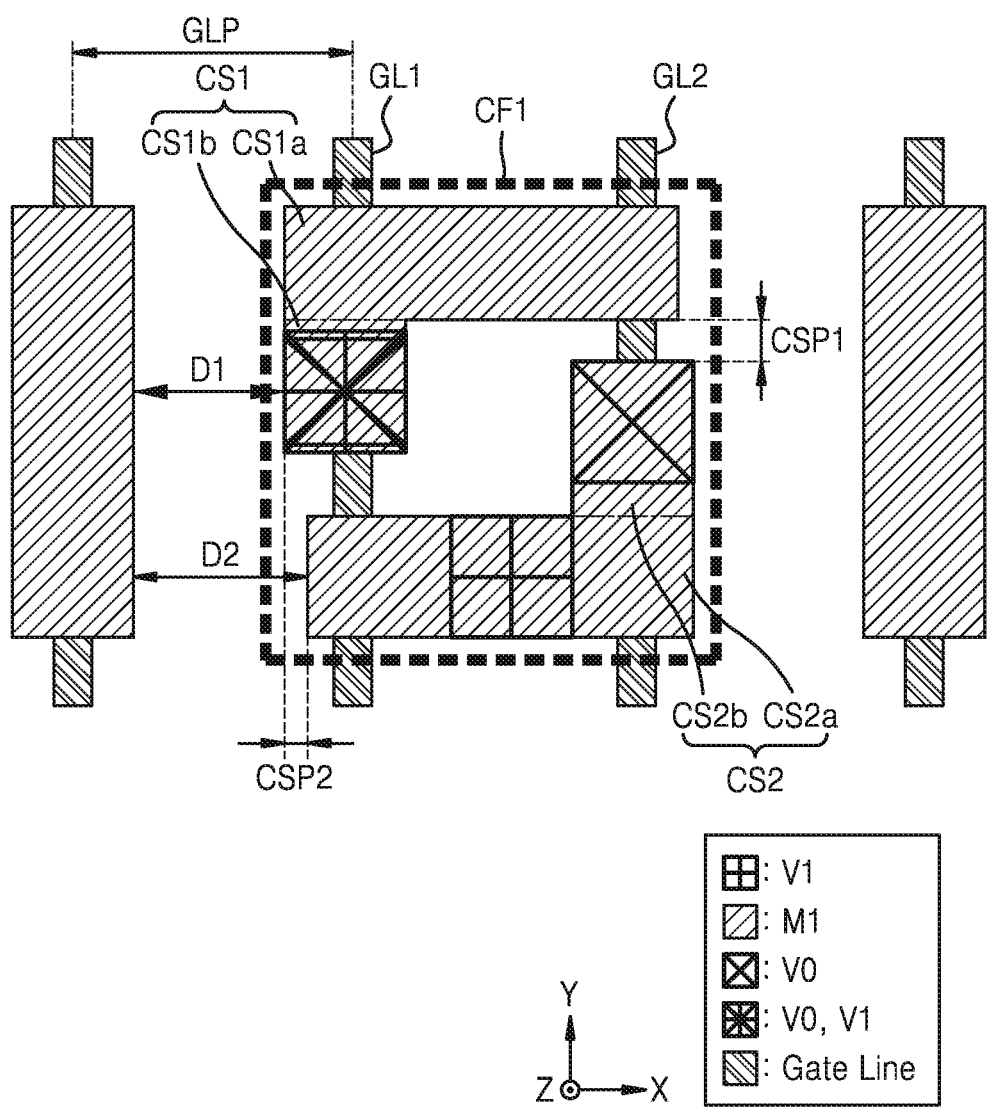
FIG. 3 is an enlarged view of a shape of the clubfoot structure conductive pattern in FIGS. 1 and 2.

FIG. 3 is an enlarged view of a shape of the clubfoot structure conductive pattern in FIGS. 1 and 2.

Referring to FIGS. 1 and 3, the plurality of first wirings M1 may include a first clubfoot structure conductive pattern CF1. The first clubfoot structure conductive pattern CF1 may include a first conductive pattern CS1 and a second conductive pattern CS2, and the first conductive pattern CS1 and the second conductive pattern CS2 may be symmetrical to each other. In one embodiment, the first conductive pattern CS1 and the second conductive pattern CS2 may be point symmetrical. In one embodiment, the first conductive pattern CS1 and the second conductive pattern CS2 may be arranged partially in parallel in the second direction Y.

The first conductive pattern CS1 may include a first line pattern CS1a and a second line pattern CS1b that are perpendicular to each other. In one embodiment, the first line pattern CS1a of the first conductive pattern CS1 may extend in the first direction X, and the second line pattern CS1b of the first conductive pattern CS1 may protrude from the first line pattern CS1a in the opposite direction (−Y) to the second direction Y. In one embodiment, the second line pattern CS1b of the first conductive pattern CS1 may protrude from one end of the first line pattern CS1a in the opposite direction (−Y) to the second direction Y, and for example, the first conductive pattern CS1 may have a shape of the letter 'L'.

The second conductive pattern CS2 may include a first line pattern CS2a and a second line pattern CS2b which are perpendicular to each other. In one embodiment, the first line pattern CS2a of the second conductive pattern CS2 may extend in the first direction X, and the second line pattern CS2b of the second conductive pattern CS2 may protrude from the first line pattern CS2a in the second direction Y. In one embodiment, the second line pattern CS2b of the second conductive pattern CS2 may protrude from one end of the first line pattern CS2a in the second direction Y, and for example, the second conductive pattern CS2 may have a shape of the letter 'L' inverted.

The first conductive pattern CS1 may connect the first gate line GL1 formed on the lower layer to one second wiring M2 (for example, M21) formed on the upper layer, and the second conductive pattern CS2 may connect the second gate line GL2 formed on the lower layer to another second wiring M2 (for example, M22) formed on the upper layer. In this case, the first gate line GL1 and the second gate line GL2 may be gate lines formed adjacent to each other, and different second wirings M2 each connected to the first gate line GL1 and the second gate line GL2 may be second wirings M2 formed adjacent to each other.

The second line pattern CS1b of the first conductive pattern CS1 and the second line pattern CS2b of the second conductive pattern CS2 may be formed to be aligned with the first gate line GL1 and the second gate line GL2 in the third directions Z, respectively. The second line pattern CS1b of the first conductive pattern CS1 and the second line pattern CS2b of the second conductive pattern CS2 may be respectively connected to the first vias V0. The second line pattern CS1b of the first conductive pattern CS1 may be connected to the first gate line GL1 via the first via V0, and the second line pattern CS2b of the second conductive pattern CS2 may be connected to the second gate line GL2 through the first via V1.

At least one of the first line pattern CS1a of the first conductive pattern CS1 and the first line pattern CS2a of the second conductive pattern CS2 may be connected to the second via V1. In one embodiment, the first gate line GL1 may be aligned in the third direction Z with one second wiring M2 (for example, M21) formed on the upper layer, and the second via V1 may be formed on the second line pattern CS1b of the first conductive pattern CS1. Since the pitch MP between the second wirings M2 is formed less than the pitch GLP between the gate lines, the second via V1 may be formed on the first line pattern CS2a of the second conductive pattern CS2 to connect the second gate line GL2 to one second wiring M2 (for example, M22). On the other hand, the second via V1 may not be formed on the first line pattern CS1a of the first conductive pattern CS1.

However, inventive concepts are not limited thereto. When the first gate line GL1 is not aligned in the third direction Z with one second wiring M2 (for example, M21) formed on the upper layer, and the second gate line GL2 is not aligned in the third direction Z with another second wiring M2 (for example, M22) formed on the upper layer, the first line pattern CS1a of the first conductive pattern CS1 and the first line pattern CS2a of the second conductive pattern CS2 may be respectively connected to the second vias V1.

The integrated circuit 10 according to inventive concepts may, due to shape characteristics of the first clubfoot structure conductive pattern CF1, efficiently connect a plurality of gate lines and a plurality of second wirings of different pitches, and the complexity of the plurality of second wirings may be reduced by forming a plurality of second wirings having a pitch less than a pitch between the plurality of gate lines on a standard cell.

The shape of the first clubfoot structure conductive pattern CF1 according to inventive concepts are not limited to the shape thereof illustrated in FIG. 3, and may have a shape that is obtained by rotating the illustrated shape of the first clubfoot structure conductive pattern CF1 by 90 degrees clockwise. The first vias V0 and the second vias V1 may be connected to the first clubfoot structure conductive pattern CF1 considering an arrangement of the first and second gate lines GL1 and GL2 formed on the lower layer of the first clubfoot structure conductive pattern CF1 and the second wirings M2 (for example, M21 and M22) formed on the upper layer of the first clubfoot structure conductive pattern CF1.

Space conditions and shape characteristics (for example, D1, D2, CSP1, and CSP2) of the first clubfoot structure conductive pattern CF1 according to the space conditions at an operation of verifying compliance of a layout of the integrated circuit 10 including the first clubfoot structure conductive pattern CF1 to a design rule will be described later with reference to FIG. 9A and the like.

Figure 4:
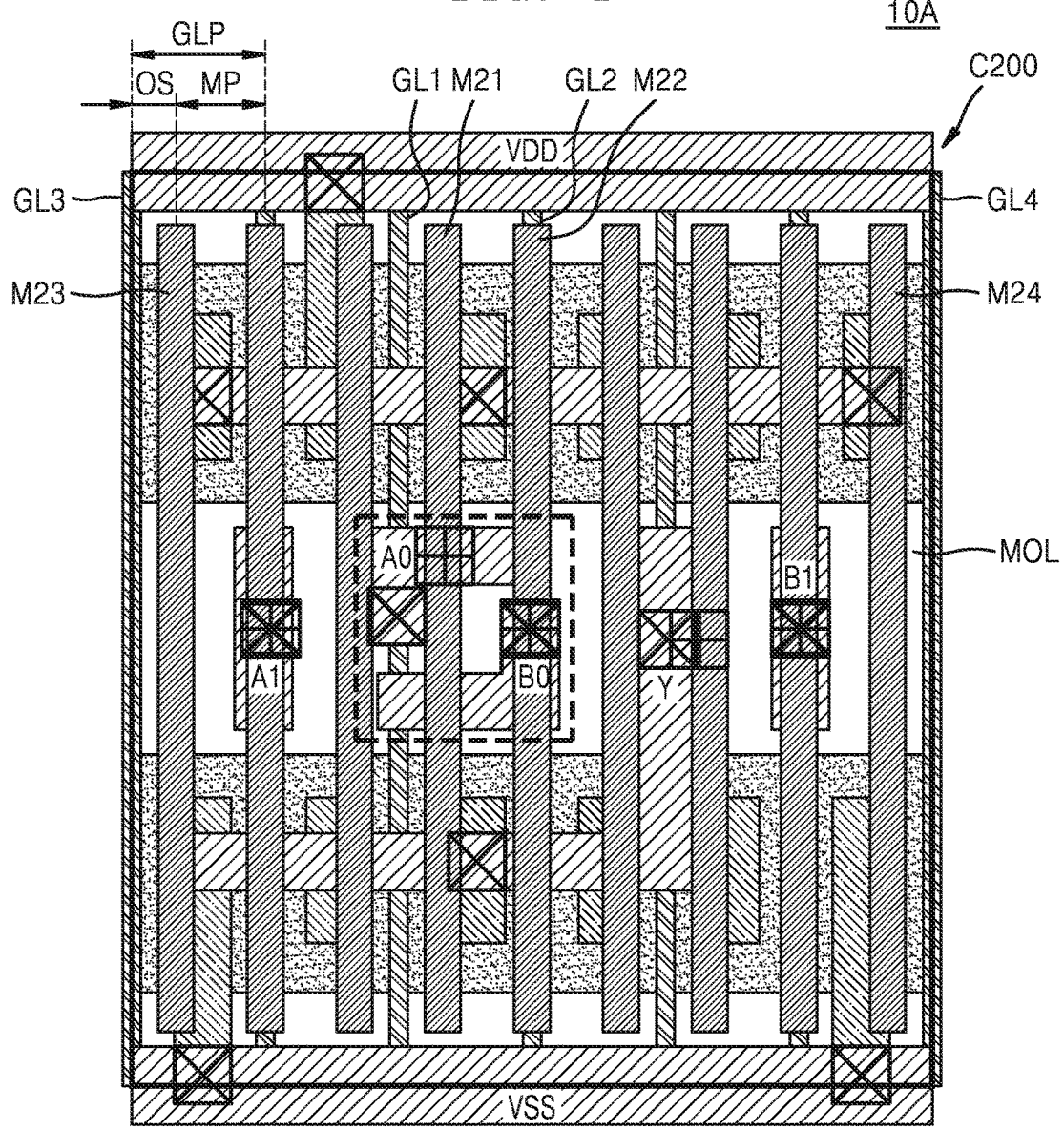
FIG. 4 is a plan view schematically illustrating a layout of an integrated circuit according to an embodiment.

FIG. 4 is a plan view schematically illustrating a layout of an integrated circuit 10A according to an embodiment. With reference to FIG. 4, repeated descriptions given with reference to FIG. 1 are omitted.

Referring to FIG. 4, the integrated circuit 10A may include at least one standard cell C200 defined by a cell boundary. The standard cell C200 may include the plurality of input pins (A0, A1, B0, and B1) and the output pin Y. The numbers of input pins and output pins may depend on characteristics of a standard cell, and are not limited to those in FIG. 4.

In one embodiment, each of the active regions AR of the standard cell C200 may be provided with one first wiring M1 extending in the first direction X. For example, the standard cell C200 may be a standard cell in which a height thereof in the second direction Y is relatively low. However, the standard cell C200 according to inventive concepts is not limited thereto, and the plurality of first wirings M1 extending in the first direction X may be formed in the active regions AR of the standard cell C200.

Each of the gate lines included in the standard cell C200 may be formed to extend in the second direction Y and may be apart from each other by the certain pitch GLP in the first direction X. The third and fourth gate lines GL3 and GL4 may be arranged on the cell boundary in the first direction X and on the cell boundary in the opposite direction (−X) of the first direction X of the standard cell C200.

The integrated circuit 10A may further include the plurality of second wirings M2 for connecting the plurality of input pins (A0, A1, B0, and B1) of the standard cell C200 and the output pin Y to the outside. The plurality of second wirings M2 may be arranged on a layer higher than the plurality of first wirings M1 and may be formed to extend in the second direction Y in parallel with the plurality of gate lines. The plurality of second wirings M2 may be apart from each other by the certain pitch MP in the first direction X.

On the cell boundary, the second wirings M2 (for example, M23 and M24) may not be aligned with the third and fourth gate lines GL3 and GL4, respectively. In other words, the second wirings M2 (for example, M23 and M24) may be arranged apart from the cell boundary by a constant offset OS. In FIG. 4, all of the plurality of gate lines are illustrated as not aligned with the second wirings M2 (for example, M23 and M24) on the cell boundary in the first direction X and in the opposite direction (−X) to the first direction X, but inventive concepts are not limited thereto. The third gate line GL3 and one second wiring M2 (for example, M23) may not be aligned on the cell boundary in the opposite direction (−X) to the first direction X, but the fourth gate line GL4 may be aligned with one second wiring M2 (for example, M24) on the cell boundary in the first direction X.

In one embodiment, the pitch MP between the plurality of second wirings M2 may be less than the pitch GLP between the first through fourth gate lines GL1 through GL4. For example, a ratio of the pitch GLP between the plurality of gate lines to the pitch MP between the plurality of second wirings M2 may be about 3:2. Accordingly, the integrated circuit 10A including the standard cell C200 according to an embodiment may be configured to form more second wirings M2 per identical area compared with the case when the pitch MP between the plurality of second wirings M2 is equal to the pitch GLP between the plurality of gate lines, and may be configured to decrease the complexity of the second wirings M2.

A computing system for designing the integrated circuit 10A according to inventive concepts may selectively arrange the standard cell C100 of FIG. 1 or the standard cell C200 in FIG. 4 according to the characteristics of other standard cells arranged adjacent thereto in the first direction X or in the opposite direction (−X) to the first direction X. An operation of arranging a standard cell for designing an integrated circuit of a computing system will be described later with reference to FIG. 8A and the like.

In one embodiment, the plurality of first wirings M1 may include the clubfoot structure conductive pattern. The plurality of first wirings M1 may include the clubfoot structure conductive pattern so that the plurality of first wirings M1 may electrically connect the first and second gate lines GL1 and GL2 adjacent to each other and formed on the lower layer of the plurality of first wirings M1 to the plurality of second wirings M2 (for example, M21 and M22) adjacent to each other and formed on the upper layer of the plurality of first wirings M1. In one embodiment, the clubfoot structure conductive pattern may be arranged in a region between the plurality of active regions AR. A shape of the clubfoot structure conductive pattern will be described with reference to FIG. 5.

Figure 5:
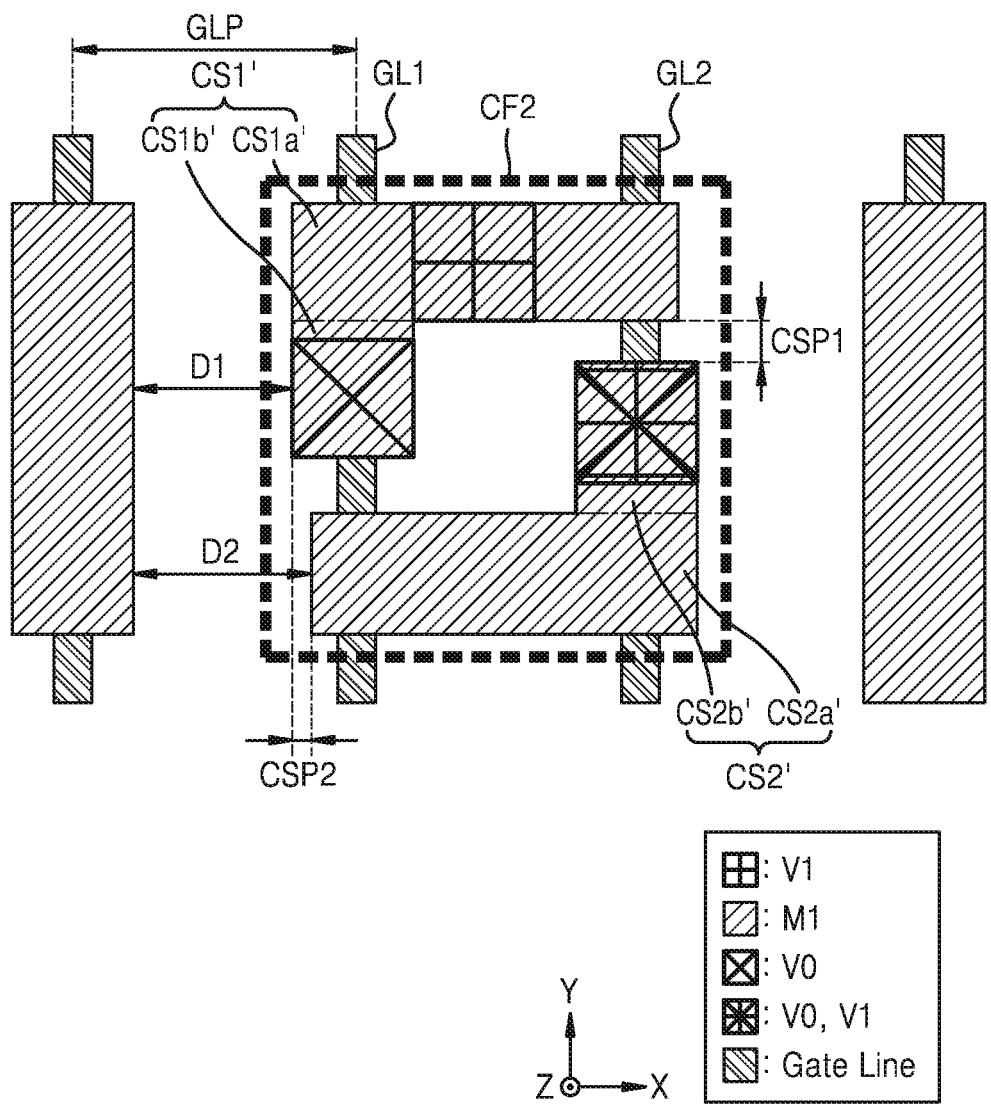
FIG. 5 is an enlarged view of a shape of the clubfoot structure conductive pattern in FIG. 4.

FIG. 5 is an enlarged view of a shape of the clubfoot structure conductive pattern in FIG. 4.

Referring to FIGS. 4 and 5, the plurality of first wirings M1 may include a second clubfoot structure conductive pattern CF2. The second clubfoot structure conductive pattern CF2 may include a first conductive pattern CS1' and a second conductive pattern CS2', and the first conductive pattern CS1' and the second conductive pattern CS2' may be symmetrical to each other. In one embodiment, the first conductive pattern CS1' and the second conductive pattern CS2' may be point symmetrical. In one embodiment, the first conductive pattern CS1' and the second conductive pattern CS2' may be arranged partially in parallel in the second direction Y.

The first conductive pattern CS1' may include a first line pattern CS1a' and a second line pattern CS1b' that are perpendicular to each other. The second conductive pattern CS2' may include a first line pattern CS2a' and a second line pattern CS2b' which are perpendicular to each other.

The first conductive pattern CS1' may connect the first gate line GL1 formed on the lower layer to one second wiring M2 (for example, M21) formed on the upper layer, and the second conductive pattern CS2' may connect the second gate line GL2 formed on the lower layer to another second wiring M2 (for example, M22) formed on the upper layer. In this case, the first gate line GL1 and the second gate line GL2 may be the gate lines formed adjacent to each other, and different second wirings M2 each connected to the first gate line GL1 and the second gate line GL2 may be second wirings M2 adjacent to each other.

The second line pattern CS1b' of the first conductive pattern CS1' and the second line pattern CS2b' of the second conductive pattern CS2' may be formed to be aligned with the first gate line GL1 and the second gate line GL2 in the third directions Z, respectively. The second line pattern CS1b' of the first conductive pattern CS1' and the second line pattern CS2b' of the second conductive pattern CS2' may be respectively connected to the first vias V0. The second line pattern CS1b' of the first conductive pattern CS1' may be connected to the first gate line GL1 via the first via V0, and the second line pattern CS2b' of the second conductive pattern CS2' may be connected to the second gate line GL2 through the first via V0.

At least one of the first line pattern CS1a' of the first conductive pattern CS1' and the first line pattern CS2a' of the second conductive pattern CS2' may be connected to the second via V1. In one embodiment, the second gate line GL2 may be aligned in the third direction Z with one second wiring M2 (for example, M22) formed on the upper layer, and the second via V1 may be formed on the second line pattern CS2b' of the second conductive pattern CS1'. Since the pitch MP between the second wirings M2 is formed to be less than the pitch GLP between the plurality of gate lines, the second via V1 may be formed on the first line pattern CS1a' of the first conductive pattern CS1' to connect the first gate line GL1 to one second wiring M2 (for example, M21).

However, inventive concepts are not limited thereto. When the first gate line GL1 is not aligned in the third direction Z with one second wiring M2 (for example, M21) formed on the upper layer, and the second gate line GL2 is not aligned in the third direction Z with another second wiring M2 (for example, M22) formed on the upper layer, the first line pattern CS1a' of the first conductive pattern CS1' and the first line pattern CS2a' of the second conductive pattern CS2' may be respectively connected to the second vias V1.

The integrated circuit 10A according to inventive concepts may, due to shape characteristics of the second clubfoot structure conductive pattern CF2, efficiently connect a plurality of gate lines and a plurality of second wirings of different pitches, and the complexity of the plurality of second wirings may be reduced by forming the plurality of second wirings having a pitch less than a pitch between the plurality of gate lines.

Space conditions and shape characteristics (for example, D1, D2, CSP1, and CSP2) of the second clubfoot structure conductive pattern CF2 according to the space conditions at an operation of verifying compliance of a layout of the integrated circuit 10A including the second clubfoot structure conductive pattern CF2 will be described later with reference to FIG. 9A and the like.

Figure 6:
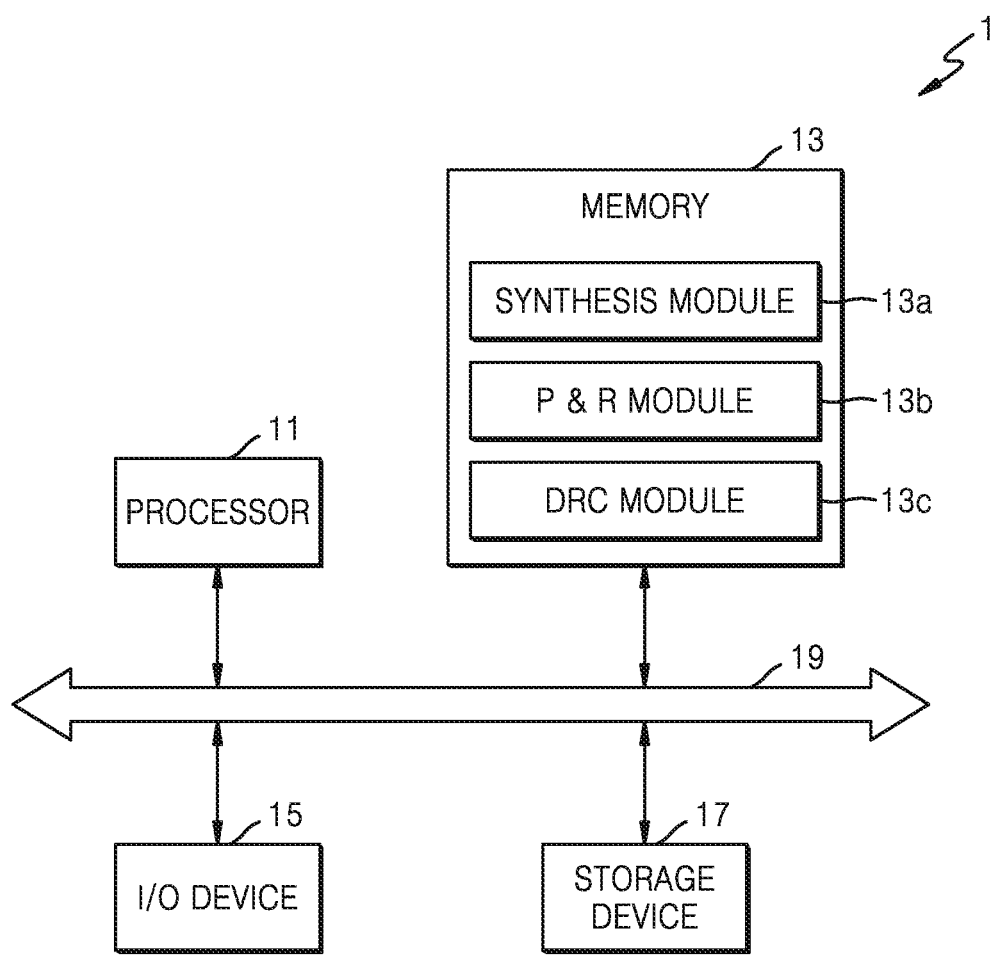
FIG. 6 is a block diagram illustrating a computing system for designing an integrated circuit according to an embodiment.

FIG. 6 is a block diagram illustrating a computing system 1 for designing an integrated circuit according to an embodiment.

Referring to FIG. 6, the computing system (hereinafter, referred to as an integrated circuit design system) 1 for designing the integrated circuit may include a processor 11, a memory 13, an input/output device 15, a storage device 17, and a bus 19. For example, the integrated circuit design system 1 may perform operations S10, S20, and S30 of FIG. 7. In the embodiment according to inventive concepts, the integrated circuit design system 1 may be implemented as an integrated device, and accordingly may be referred to as an integrated circuit design device. The integrated circuit design system 1 may be provided as a dedicated device for designing an integrated circuit of a semiconductor device, but may also be a computer for driving various simulation tools or design tools. The integrated circuit design system 1 may be a fixed computing system such as a desktop computer, a workstation, and a server, or a portable computing system such as a laptop computer.

The processor 11 may be configured to execute instructions that perform at least one of various operations for designing the integrated circuit. The processor 11 may communicate with the memory 13, the input/output device 15, and the storage device 17 via the bus 19. The processor 11 may execute application programs loaded in the memory 13. For example, the processor 11 may execute a synthesis module 13a, a place and routing (P&R) module 13b, and a design rule check (DRC) module 13c loaded in the memory 13.

The memory 13 may store a program including a layout design for designing the integrated circuit and instructions for performing a simulation according to the designed layout. In one embodiment, the memory 13 may store the synthesis module 13a, the P&R module 13b, and the DRC module 13c. The synthesis module 13a, the P&R module 13b, and the DRC module 13c may be loaded into the memory 13 from the storage device 17.

Figure 7:
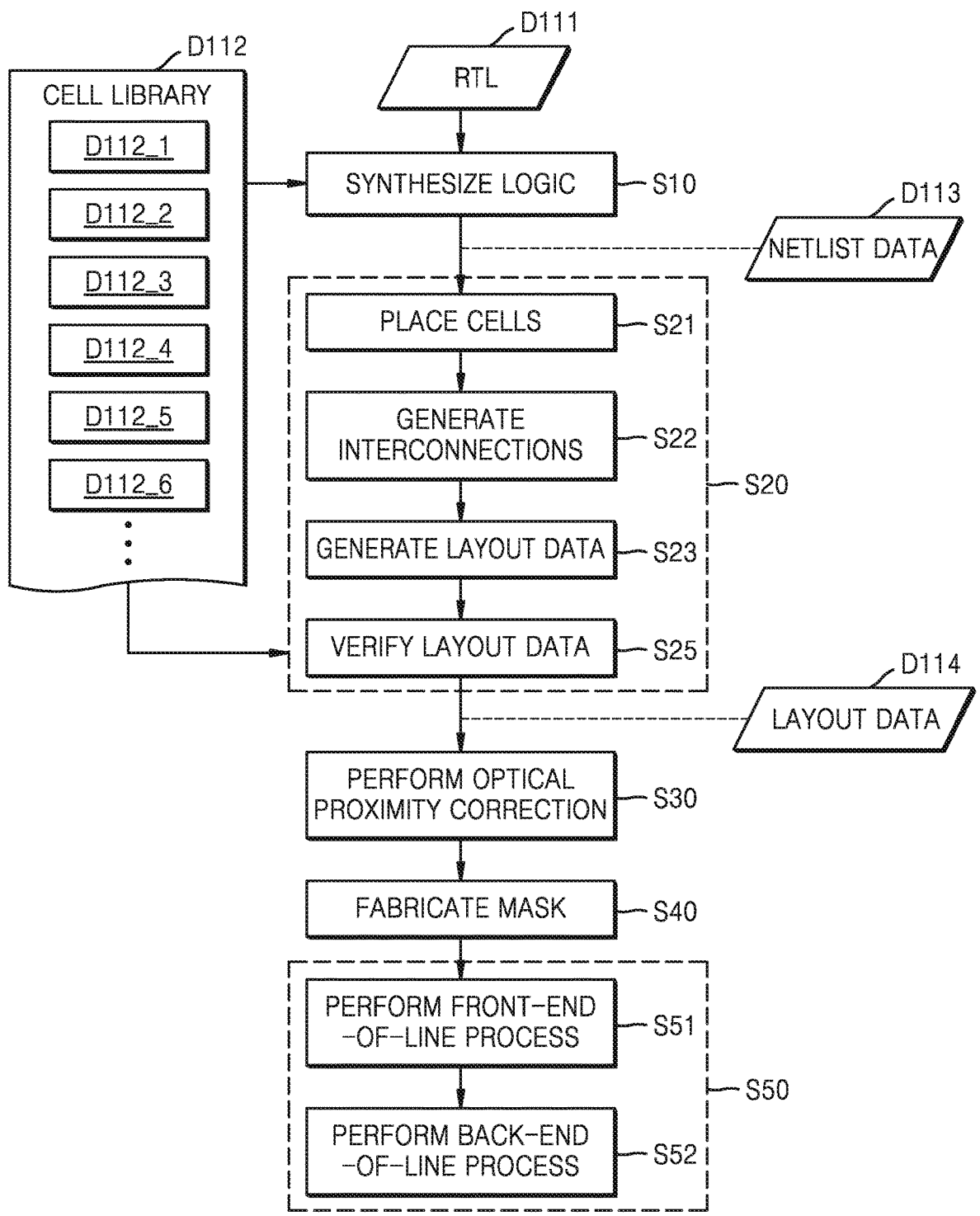
FIG. 7 is a flowchart of a method of manufacturing an integrated circuit according to an embodiment.

The synthesis module 130a may be, for example, a program including a plurality of instructions for performing a logic synthesis operation according to operation S10 of FIG. 7. The P&R module 130b may be, for example, a program including a plurality of instructions for performing layout design operations according to operations S21 and S22 of FIG. 7. The DRC module 13c may be, for example, a program including a plurality of instructions for performing a DRC operation according to operation S25 of FIG. 7. However, inventive concepts are not limited thereto, and the memory 13 may further store various tools such as a simulation tool. The memory 13 may be a volatile memory such as static random access memory (RAM) (SRAM) and dynamic RAM (DRAM) or a nonvolatile memory such as phase change RAM (PRAM), magnetic RAM (MRAM), resistive RAM (ReRAM), ferroelectric RAM (FRAM) and a flash memory.

The input/output device 15 may control a user's input and output from user interface devices. For example, the input/output device 15 may be provided with an input device such as a keyboard, a mouse, and a touch pad to receive integrated circuit design data. For example, the input/output device 15 may include an output device such as a display and a speaker to display layout results, routing results, layout data, DRC results, and the like.

The storage device 17 may store programs such as the synthesis module 13a, the P&R module 13b, and the DRC module 13c, and the program or at least a portion thereof may be loaded into the memory 13 from the storage device 17 before the program is executed by the processor 11. The storage device 17 may store data to be processed by the processor 11 or data processed by the processor 11. For example, the storage device 17 may store data (for example, a standard cell library, netlist data, etc.) to be processed by a program such as the synthesis module 13a, the P&R module 13b, and the DRC module 13c, and data (for example, the DRC results, the layout data, etc.) generated by the program.

The storage device 17 may include a nonvolatile memory such as electrically erasable programmable read-only memory (ROM) EEPROM, a flash memory, PRAM, RRAM, MRAM, and FRAM, and a storage medium such as a solid state drive (SSD), a hard disk drive (HDD), magnetic tape, an optical disk, and a magnetic disk. In addition, the storage device 17 may be removable from the integrated circuit design system 1.

The bus 19 may be a system bus for providing a network inside the computer system. The processor 11, the memory 13, the input/output device 15, and the storage device 17 may be electrically connected to each other and exchange data with each other via the bus 19.

FIG. 7 is a flowchart of a method of manufacturing an integrated circuit, according to an embodiment.

Referring to FIG. 7, a cell library D112 may include information about cells, for example, function information, characteristic information, layout information, and the like. As illustrated in FIG. 7, the cell library D112 may include first information D112_1 about the standard cell which includes the clubfoot structure conductive pattern and in which the gate line and one second wiring M2 are aligned with each other in the cell boundary in the opposite direction (−X) to the first direction X, second information D112_2 about the standard cell which includes the clubfoot structure conductive pattern and in which the gate line and another second wiring M2 are not aligned with each other in the cell boundary in the opposite direction (−X) to the first direction X, third information D112_3 about the standard cell which includes the clubfoot structure conductive pattern and in which a width thereof in the first direction X is an even multiple of the pitch GLP of the gate lines, fourth information D12_4 about the standard cell which includes the clubfoot structure conductive pattern and in which the width thereof in the first direction X is an odd multiple of the pitch GLP of the gate lines, and fifth information D112_5 about a dummy standard cell. The cell library D112 may be stored in the storage device 17 of FIG. 6.

A logic synthesis operation of generating netlist data D113 from register-transfer level (RTL) data D111 may be performed (S10). For example, a semiconductor design tool (for example, a logic synthesis tool) may generate netlist data D113 including a bitstream or a netlist by performing a logic synthesis with reference to the cell library D112, from the RTL data D111, which is written in hardware description language (HDL) such as very-high-speed integrated circuits (VHSIC) HDL (VHDL) and Verilog.

A P&R operation of generating layout data D114 from the netlist data D113 may be performed (S20). The P&R operation S20 may include operations S21, S22, S23, and S25.

An operation of selectively placing cells may be performed (S21). The operation of arranging the standard cells will be described later with reference to FIGS. 8A through 8D.

An operation of generating interconnections may be performed (S22). The interconnections may electrically connect the output pins of the standard cell to the input pins of the standard cell and may include, for example, at least one via and at least one conductive pattern. The standard cells may be routed by generating the interconnections.

An operation of generating the layout data D114 may be performed (S23). The layout data D114 may have a format such as graphic database system information interchange (GDSII) and may include geometric information about the standard cells and the interconnections.

A verifying operation on the layout data D114 to determine whether there is a portion that violates the design rule may be performed (S25). For example, the verifying operation may include a DRC verifying whether the layout complies with the design rule, an electrical rule check (ERC) verifying whether components in the integrated circuit are properly electrically connected without disconnections, a layout versus schematic (LVS) check verifying whether the layout matches a gate-level netlist and the like.

In one embodiment, at least one of operations S21, S22, and S23 may be performed again based on the verification result of operation S25, whereby the layout data D114 may be regenerated. For example, when a design rule error indicating that pitches between internal wirings and routing wirings are less than a certain pitch occurs in at least one standard cell among the arranged standard cells as a result of the DRC operation, operation S23 may be performed and locations of the internal wirings may be adjusted.

In this case, a separate DRC operation may not be performed for the clubfoot structure conductive pattern included in the standard cell. In one embodiment, the cell library D112 may include marker information D112_6 corresponding to the clubfoot structure conductive pattern. The marker information D112_6 may be about a virtual layer, and the DRC operation may not be performed for the clubfoot structure conductive pattern based the marker information D112_6. In other words, even when the shape of the clubfoot structure conductive pattern violates the DRC, it may be determined that the standard cell does not violate the DRC. This matter will be described later with reference to FIG. 9.

An operation of optical proximity correction (OPC) may be performed (S30). Layout patterns obtained through the layout design may be implemented on a silicon substrate by using a photolithography process. In this case, the OPC may be a technique for correcting a distortion phenomenon that occurs in the photolithography process. In other words, the distortion phenomenon such as a refraction effect or a process effect, which is caused by characteristics of light at the time of exposure by using the layout pattern, may be corrected through the OPC. While the OPC is performed, the shapes and positions of designed layout patterns may be slightly changed.

An operation of manufacturing a mask may be performed (S40). For example, patterns formed on a plurality of layers may be defined according to the layout data D114, and at least one mask (or photomask) for forming patterns on each of the plurality of layers may be manufactured.

An operation of fabricating the integrated circuit may be performed (S50). For example, the integrated circuit may be fabricated by patterning the plurality of layers by using the at least one mask manufactured in operation S40. Operation S50 may include operations S51 and S52.

A process of front-end-of-line (FEOL) may be performed (S51). The FEOL may be referred to as a process of forming individual elements, for example, transistors, capacitors, and resistors on a substrate in an integrated circuit fabricating process. In one embodiment, the FEOL may include planarizing and cleaning a wafer, forming a trench, forming a well, forming a gate line, forming a source and a drain, and the like.

A back-end-of-line (BEOL) process may be performed (S52). The BEOL may be referred to as a process of interconnecting individual elements, for example, transistors, capacitors, and resistors in the integrated circuit fabricating process. In one embodiment, the BEOL may include silicidating gate, source, and drain regions, adding dielectric, planarizing, forming holes, adding metal layers, forming vias, and forming passivation layers, and the like. Next, the integrated circuit may be packaged in a semiconductor package and may be used as a component for various applications.

Through the BEOL process (S52), conductive patterns according to an example embodiment may be formed, and the vias electrically connected to the conductive patterns may be formed. For example, the layout data D114 may include geometric information about output pins of a standard cell defined by the cell library D112, and the output pins may be formed by the BEOL process using the mask manufactured according to the layout data D114. In addition, the layout data D114 may include geometric information about vias arranged in limited regions of the output pins of the standard cell, and the vias may be formed by the BEOL process using the mask manufactured according to the layout data D114.

FIGS. 8A through 8D are schematic plan views respectively illustrating layouts of integrated circuits 10B, 10C, 10D, and 10E according to embodiments. FIGS. 8A through 8D respectively illustrate integrated circuits 10B, 10C, 10D, and 10E each including a plurality of standard cells arranged adjacent to each other.

Referring to FIG. 8A, the integrated circuit 10B may include a first standard cell C100_1 and a second standard cell C100_2 defined by respective cell boundaries. The first standard cell C100_1 and the second standard cell C100_2 may include the plurality of gate lines, and the plurality of gate lines may extend in the second direction Y and be arranged at a first pitch GLP with respect to each other in the first direction X.

The plurality of second wirings M2 may be formed in the first standard cell C100_1 and the second standard cell C100_2. The plurality of second wirings M2 may be apart from each other by the second pitch MP in the first direction X. In other words, the plurality of second wirings M2 may be arranged in parallel with the plurality of gate lines. In this case, the second pitch MP may be less than the first pitch GLP, and for example, the ratio of the first pitch GLP to the second pitch MP may be about 3:2. When the ratio of the first pitch GLP to the second pitch MP is about 3:2, states in which the plurality of gate lines and the plurality of second wirings M2 are aligned or not aligned with each other in the third direction Z may be alternately repeated, and since there is a high possibility that the plurality of gate lines and the plurality of second wirings M2 are aligned with each other as compared with other ratios, it becomes easy to electrically connect them to each other.

The widths of the first standard cell C100_1 and the second standard cell C100_2 in the first direction X may vary depending on the number of gate lines formed in the first standard cell C100_1 and the second standard cell C100_2. In one embodiment, the width of the first standard cell C100_1 and the second standard cell C100_2 in the first direction X may be an even multiple (or, 2n*GLP) of the first pitch GLP. Here, n may be a natural number of 1 or more. In FIG. 8A, the number of gate lines formed in the first standard cell C100_1 and the second standard cell C100_2 are shown as being equal, but the integrated circuit 10B according to inventive concepts is not limited thereto. The number of gate lines formed in the first standard cell C100_1 and the number of gate lines formed in the second standard cell C100_2 may be different from each other.

In the integrated circuit 10B, the second wirings M2 may be arranged in the cell boundaries of the first standard cell C100_1 and the second standard cell C100_2. As an example, the first standard cell C100_1 and the second standard cell C100_2 may be the standard cell C100 of FIG. 1.

In the integrated circuit 10B according to inventive concepts, the second standard cell C100_2 arranged adjacent to the first standard cell C100_1 may have different structures even though a same function is performed, depending on the ratio of the first pitch GLP to the second pitch MP, the width of the standard cell C100_1 in the first direction X, and an arrangement of the second wirings M2. In FIG. 8A, the ratio of the first pitch GLP to the second pitch MP may be about 3:2, and the width of the first standard cell C100_1 in the first direction X may be an even number multiple (2n*GLP) of the first pitch GLP. Since the gate line and the second wiring M2 are aligned with each other on the cell boundary of the first standard cell C100_1 in the opposite direction (−X) to the first direction X, the gate line and the second wiring M2 may be aligned with each other on the cell boundary of the first standard cell C100_1 in the first direction X. Accordingly, in the integrated circuit 10B, the second standard cell C100_2 in which the gate line and the second wiring M2 are aligned with each other on the cell boundary in the opposite direction (−X) to the first direction X may be arranged adjacent to the first standard cell C100_1.

The computing system for designing the integrated circuit 10B according to an example embodiment may be configured such that the second standard cell C100_2 is arranged based on the first information D112_1 and the third information D112_3 in operation S21 in FIG. 7. However, the computing system for designing the integrated circuit 10B according to an example embodiment may be configured such that a standard cell having a width in the first direction X as an odd multiple (or, (2n−1)*GLP) of the first pitch GLP may be arranged adjacent to the first standard cell C100_1 based on the first information D112_1 and the fourth information D112_4 in operation S21 in FIG. 7.

Figure 8B:
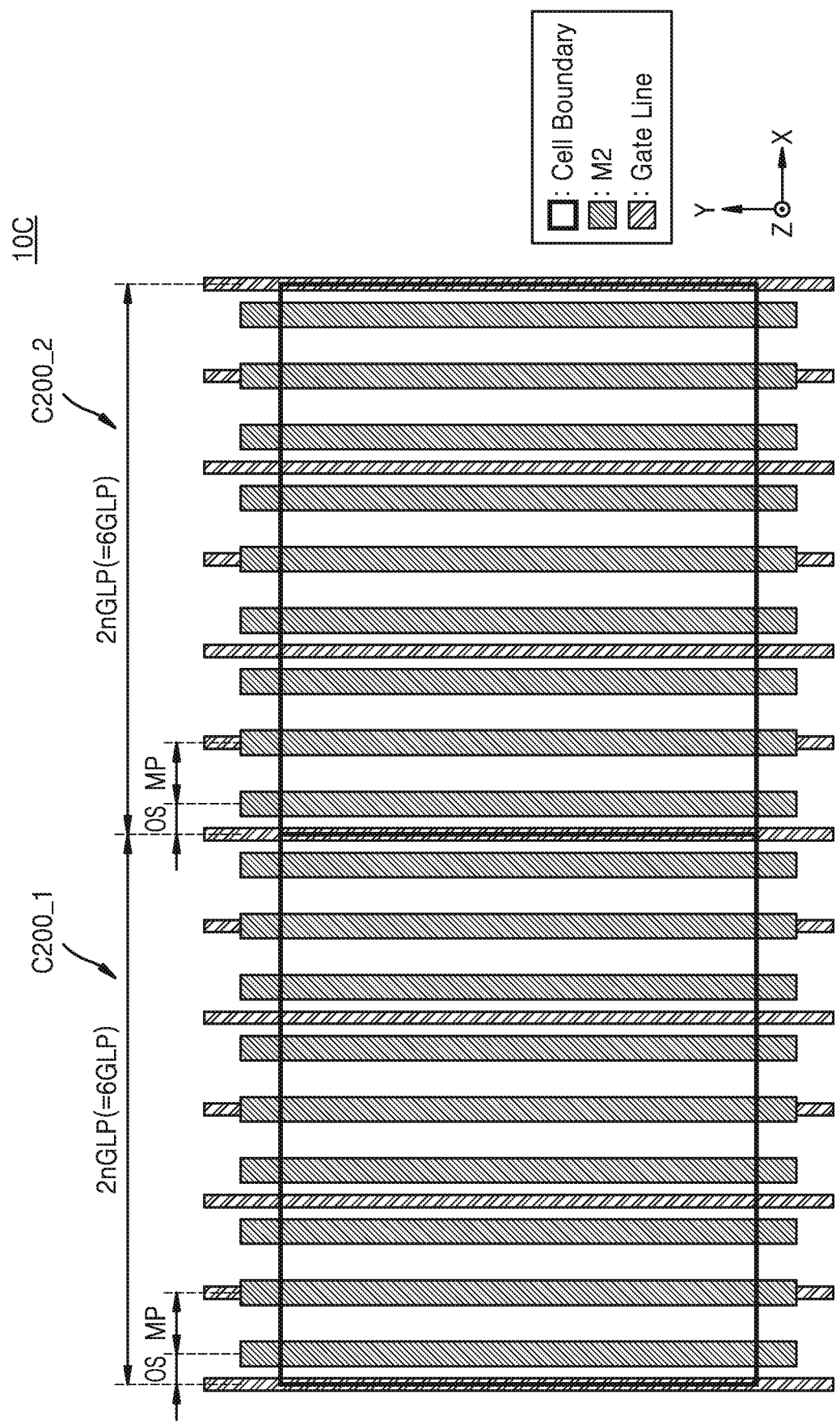

Referring to FIG. 8B, an integrated circuit 10C may include a third standard cell C200_1 and a fourth standard cell C200_2 defined by cell boundaries, respectively. In one embodiment, the widths of the third standard cell C200_1 and the fourth standard cell C200_2 in the first direction X may be an even multiple (or, 2n*GLP) of the first pitch GLP. Here, n may be a natural number of 1 or more. In FIG. 8B, the number of gate lines formed in the third standard cell C200_1 and the number of gate lines formed in the fourth standard cell C200_2 are shown as being equal, but the integrated circuit 10C according to inventive concepts is not limited thereto. The number of gate lines formed in the third standard cell C200_1 and the number of gate lines formed in the fourth standard cell C200_2 may be different from each other.

The integrated circuit 10C may not include the second wiring M2 in the cell boundaries of the third standard cell C200_1 and the fourth standard cell C200_2, and the second wiring M2 may be arranged apart from the cell boundaries by the offset OS. As an example, the third standard cell C200_1 and the fourth standard cell C200_2 may be the standard cell C200 of FIG. 4.

In the integrated circuit 10C according to inventive concepts, the fourth standard cell C200_2 arranged adjacent to the third standard cell C200_1 may have different structures even though a same function is performed, depending on the ratio of the first pitch GLP to the second pitch MP, the width of the third standard cell C200_1 in the first direction X, and an arrangement of the second wirings M2. In FIG. 8B, the ratio of the first pitch GLP to the second pitch MP may be about 3:2, and the width of the third standard cell C200_1 in the first direction X may be an even number multiple (or, 2n*GLP) of the first pitch GLP. Since the gate line and the second wiring M2 are not aligned with each other in the cell boundary of the third standard cell C200_1 in the opposite direction (−X) to the first direction X, the gate line and the second wiring M2 may not be aligned with each other in the cell boundary of the third standard cell C200_1 in the first direction X. Accordingly, in the integrated circuit 10C, the fourth standard cell C200_2 in which the gate line and the second wiring M2 are not aligned with each other in the cell boundary in the opposite direction (−X) to the first direction X may be arranged adjacent to the third standard cell C200_1.

The computing system for designing the integrated circuit 10C according to an example embodiment may be configured such that the fourth standard cell C200_2 is arranged based on the second information D112_2 and the third information D112_3 in operation S21 in FIG. 7. However, the computing system for designing the integrated circuit 10C according to an example embodiment may be configured such that a standard cell having a width in the first direction X as the odd multiple (or, (2n−1)*GLP) of the first pitch GLP may be arranged adjacent to the third standard cell C200_1 based on the second information D112_2 and the fourth information D112_4 in operation S21 in FIG. 7.

Figure 8C:
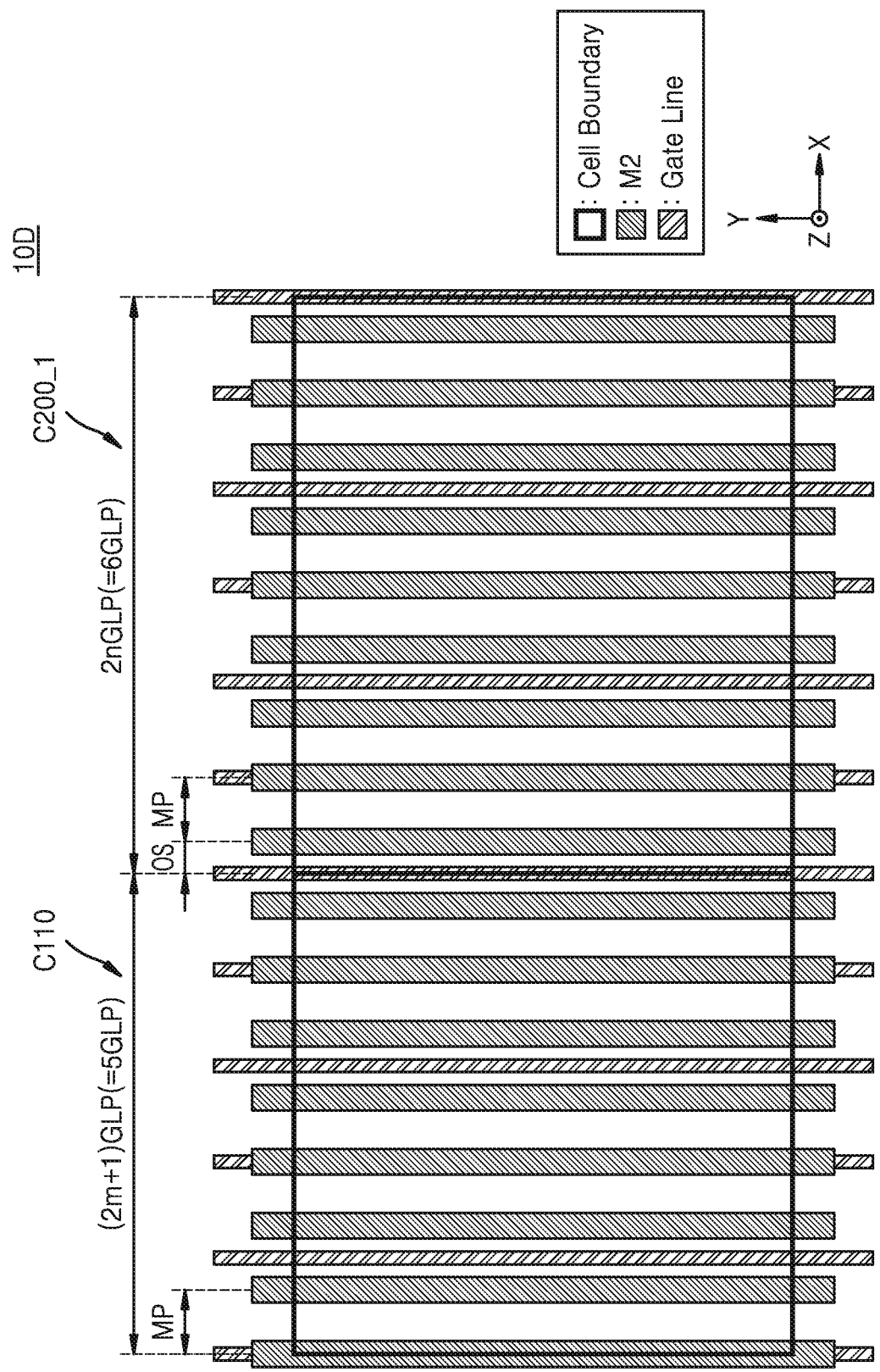

Referring to FIGS. 7 and 8C, an integrated circuit 10D may include the third standard cell C200_1 and a fifth standard cell C110 defined by respective cell boundaries. In one embodiment, a width of the fifth standard cell C110 in the first direction X may be an odd multiple (or, (2m+1)*GLP) of the first pitch GLP, and the width of the third standard cell C200_1 in the first direction X may be the even multiple (or, 2n*GLP) of the first pitch GLP. Here, m may be a natural number of 1 or more.

The second wiring M2 may be arranged in the cell boundary of the fifth standard cell C110 in the opposite direction (−X) to the first direction X, and the second wiring M2 may not be arranged in the cell boundary of the fifth standard cell C110 in the first direction X. In addition, the second wiring M2 may not be arranged in the cell boundary of the third standard cell C200_1, and the second wiring M2 may be arranged apart from the cell boundary by the offset OS. For example, the third standard cell C200_1 may be the standard cell C200 in FIG. 4.

In the integrated circuit 10D according to inventive concepts, the third standard cell C200_1 arranged adjacent to the fifth standard cell C110 may have different structures even though a same function is performed, depending on the ratio of the first pitch GLP to the second pitch MP, the width of the fifth standard cell C110 in the first direction X, and an arrangement of the second wirings M2. In FIG. 8C, the ratio of the first pitch GLP to the second pitch MP may be about 3:2, and the width of the fifth standard cell C110 in the first direction X may be an odd multiple (or, (2m+1)*GLP) of the first pitch GLP. Since the gate line and the second wiring M2 are aligned with each other in the cell boundary of the fifth standard cell C110 in the opposite direction (−X) to the first direction X, the gate line and the second wiring M2 may be aligned with each other on the cell boundary of the fifth standard cell C110 in the first direction X. Accordingly, in the integrated circuit 10D, the third standard cell C200_1 in which the gate line and the second wiring M2 are not aligned with each other in the cell boundary in the opposite direction (−X) to the first direction X may be arranged adjacent to the fifth standard cell C110.

The computing system for designing the integrated circuit 10D according to an example embodiment may be configured such that the third standard cell C200_1 is arranged based on the second information D112_2 and the third information D112_3 in operation S21 in FIG. 7. However, the computing system for designing the integrated circuit 10D according to an example embodiment may be configured such that a standard cell having a width in the first direction X as the odd multiple (or, (2n−1)*GLP) of the first pitch GLP may be arranged adjacent to the fifth standard cell C110 based on the second information D112_2 and the fourth information D112_4 in operation S21 in FIG. 7.

Figure 8D:
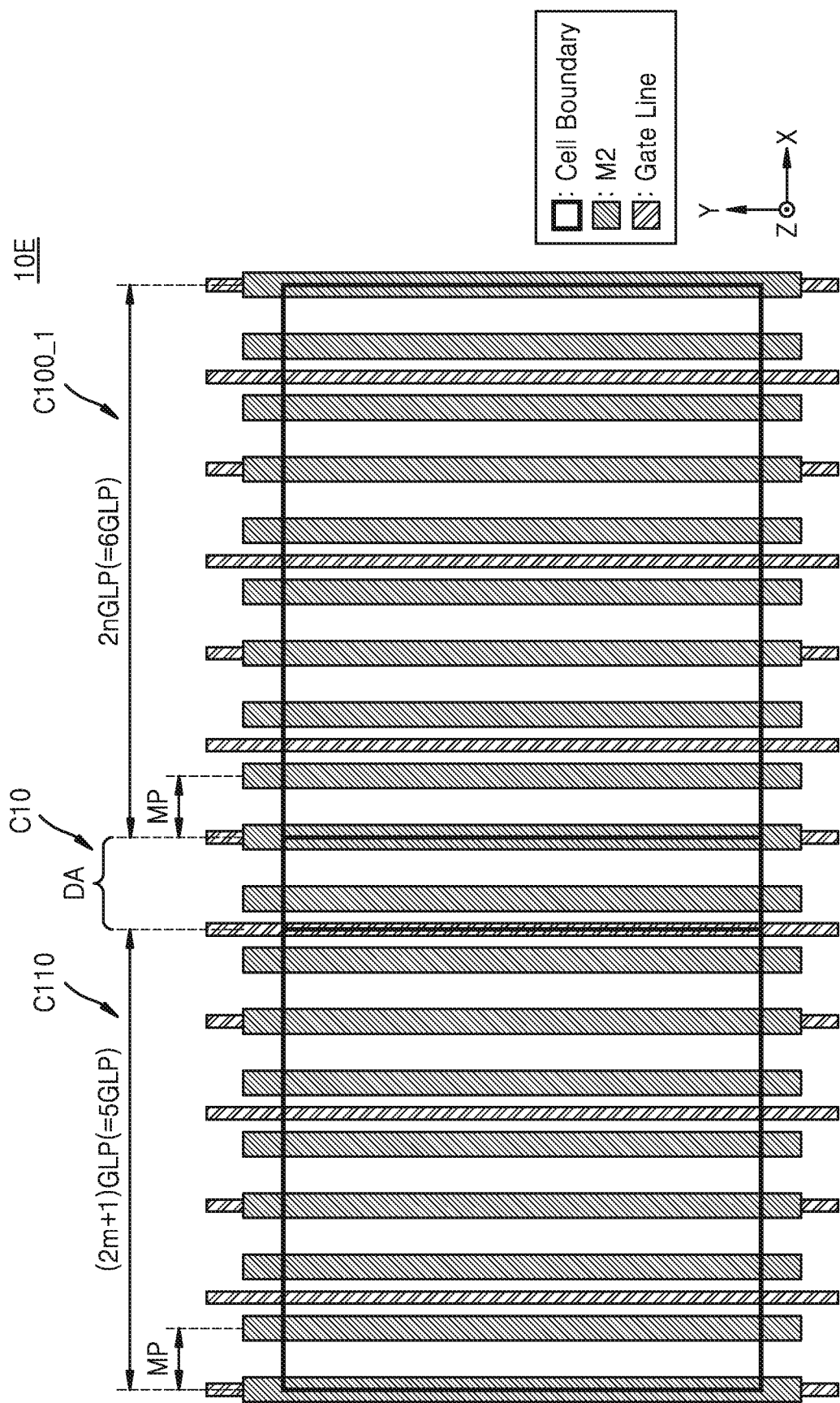

Referring to FIGS. 7 and 8D, an integrated circuit 10E may include the first standard cell C100_1, the fifth standard cell C110, and a dummy cell C10 defined by respective cell boundaries. In one embodiment, a width of the fifth standard cell C110 in the first direction X may be an odd number multiple (or, (2m+1)*GLP) of the first pitch GLP, and the width of the first standard cell C100_1 in the first direction X may be the even multiple (or, 2n*GLP) of the first pitch GLP. Here, m may be a natural number of 1 or more.

The second wiring M2 may be arranged in the cell boundary of the fifth standard cell C110 in the opposite direction (−X) to the first direction X, and the second wiring M2 may not be arranged in the cell boundary of the fifth standard cell C110 in the first direction X. In addition, the second wiring M2 may not be arranged in the cell boundary of the first standard cell C100_1, and the second wiring M2 may be arranged apart from the cell boundary by the offset OS. For example, the first standard cell C100_1 may be the standard cell C100 in FIG. 1.

In this case, the dummy cell C10 including a dummy area DA may be arranged between the fifth standard cell C110 and the first standard cell C100_1. For example, the dummy cell C10 may include at least one of a filler, a decap, or a spare cell. The filler may simply fill an empty space generated during a layout design process. The decap may be provided between power lines (for example, VDD and VSS in FIG. 1) for a stable power supply. The spare cell may be a cell prepared for additional design after the layout design is completed.

In the integrated circuit 10E according to inventive concepts, the first standard cell C100_1 arranged adjacent to the fifth standard cell C110 may have different structures even though a same function is performed, depending on the ratio of the first pitch GLP to the second pitch MP, the width of the fifth standard cell C110 in the first direction X, and an arrangement of the second wirings M2. When the first standard cell C100_1 is arranged immediately adjacent to the fifth standard cell C110, since patterns of the plurality of second wirings M2 arranged in the fifth and first standard cells C110 and C100_1 do not maintain the second pitch MP in a cell boundary between the fifth and first standard cells C110 and C100_1 and become less than the second pitch MP, it may be determined that the patterns violate the design rule. Accordingly, the dummy cell C10 including the dummy area DA may be arranged between the fifth and first standard cells C110 and C100_1.

The computing system for designing the integrated circuit 10E according to the example embodiment may be configured such that, after the dummy cell C10 is arranged adjacent to the fifth standard cell C110 based on the fifth information D112_5 in operation S21 in FIG. 7, the first standard cell C100_1 is arranged adjacent to the dummy cell C10 based on the first information D112_1 and the third information D112_3. However, the computing system according to inventive concepts may be configured such that a standard cell having a width of an odd number multiple of the first pitch GLP in the first direction X is arranged adjacent to the dummy cell C10 based on the first information D112_1 and the fourth information D112_4.

Figure 9A:
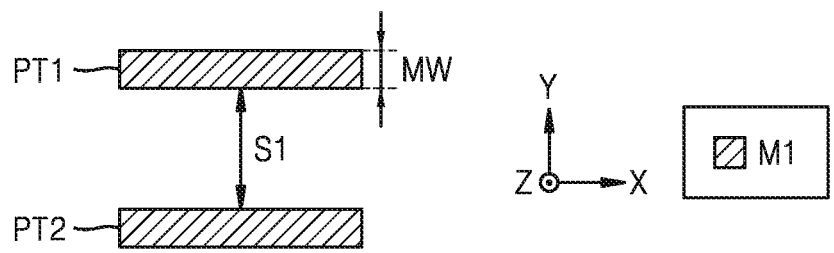
FIGS. 9A through 9C illustrate space constraints for patterns according to embodiments.
Figure 9B:
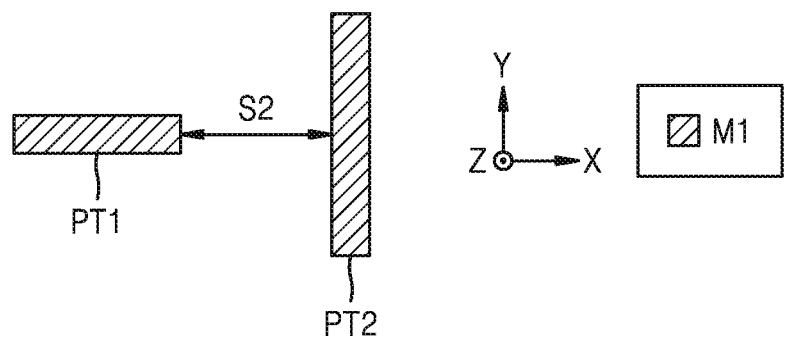
Figure 9C:
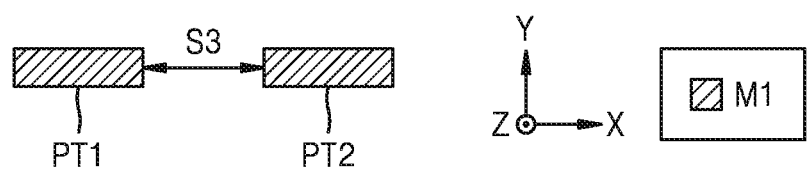

FIGS. 9A through 9C illustrate space constraints for patterns according to embodiments. In the embodiment, a first pattern PT1 and second pattern PT2 may be patterns of the plurality of first wirings M1. In this embodiment, a 'side' may refer to an edge in a direction of a long edge of each pattern, and a 'tip' may refer to an edge in a direction of a short edge of each pattern.

Referring to FIG. 9A, the first and second patterns PT1 and PT2 may extend in the first direction X and may be adjacent to each other in the second direction Y. For example, the first and second patterns PT1 and PT2 may be arranged on two adjacent tracks, respectively. A first space Si may be defined as a certain side-to-side space between the first and second patterns PT1 and PT2. A metal width MW may correspond to a certain width of the first and second patterns PT1 and PT2, and may be a length of the edge in the direction of the short edge of the each pattern, that is, a length of the tip.

Referring to FIG. 9B, the first pattern PT1 may extend in the first direction X and the second pattern PT2 may extend in the second direction Y. For example, the first pattern PT1 may be arranged on one track, and the second pattern PT2 may be arranged across several tracks. A second space S2 may be defined as a certain tip-to-side space between the first and second patterns PT1 and PT2.

Referring to FIG. 9C, the first and second patterns PT1 and PT2 may extend in the first direction X and may be adjacent to each other in the first direction X. For example, the first and second patterns PT1 and PT2 may be arranged on the same track. Referring to FIG. 9C, a third space S3 may be defined as a certain tip-to-tip space between the first and second patterns PT1 and PT2.

In one embodiment, the first space 51 may be less than the second space S2, and the second space S2 may be less than the third space S3.

Referring to FIGS. 3 and 5, the plurality of first wirings M1 may satisfy requirements of the first through third spaces 51 through S3, and a metal width MW so that the design rule is not violated in operation S25 of FIG. 7.

However, inner patterns of the first and second clubfoot structure conductive patterns CF1 and CF2 may not satisfy the requirements of the first through third spaces 51 through S3, and the width MW. In other words, a first conductive shape pattern distance CSP1 between the first conductive patterns CS1 and CS1', and the second conductive patterns CS2 and CS2' may have a value less than the second space S2. For example, the first conductive shape pattern distance CSP1 between the first line patterns CS1a and CS1a' of the first conductive patterns CS1 and CS1', and the second line patterns CS2b and CS2b' of the second conductive patterns CS2 and CS2' may be less than a pitch between the plurality of first wirings M1 except for the clubfoot structure conductive pattern. In one embodiment, the plurality of first wirings M1 except for the first and second clubfoot structure conductive patterns CF1 and CF2 may be apart from each other by a distance substantially equal to the pitch GLP between the plurality of gate lines.

A computing system for designing an integrated circuit may be classified as an exception of applying a design rule to an internal pattern of a clubfoot structure conductive pattern based on marker information. In operation S50 in FIG. 7, the first and second clubfoot structure conductive patterns CF1 and CF2 may be fabricated not by respective separate operations of patterning the first conductive pattern CS1 and CS1', and the second conductive patterns CS2 and CS2', but by simultaneously forming the first conductive pattern CS1 and CS1', and the second conductive patterns CS2 and CS2'.

A first distance D1 and a second distance D2 between the first and second clubfoot structure conductive patterns CF1 and CF2 and the first wirings M1 adjacent thereto, respectively, may satisfy the requirements of the first space 51 or the second space S2. For example, the first distance D1 from the first conductive patterns CS1 and CS1' to the first wiring M1 may satisfy the requirement of the first space 51 as a distance from the first conductive patterns CS1 and CS1' to the first wiring M1 adjacent thereto in the opposite direction (−X) of the first direction X, and the second distance D2 from the second conductive patterns CS2 and CS2' to the first wiring M1 may satisfy the requirement of the second space S2. The second distance D2 from the second conductive patterns CS2 and CS2' to the first wiring M1 may be greater than the first distance D1 from the first conductive patterns CS1 and CS1' to the first wiring M1.

Accordingly, in the first and second clubfoot structure conductive patterns CF1 and CF2, ends of the first conductive patterns CS1 and CS1' in the opposite direction (−X) to the first direction X and ends of the second conductive patterns CS2 and CS2' in the opposite direction (−X) to the first direction X may be apart from each other by a second conductive shape pattern distance CSP2 in the first direction X. Accordingly, in the first and second clubfoot structure conductive patterns CF1 and CF2, ends of the first conductive patterns CS1 and CS1' in the first direction X and ends of the second conductive patterns CS2 and CS2' in the first direction X may be apart from each other by the second conductive shape pattern distance CSP2 in the first direction X.

Figure 10:
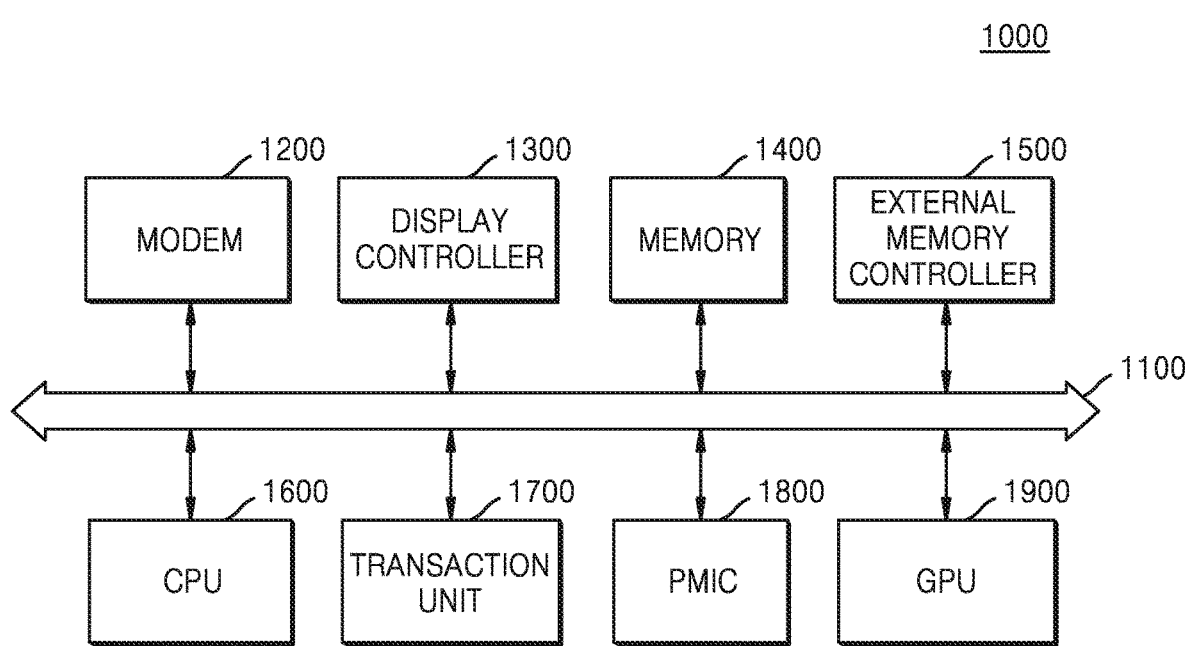
FIG. 10 is a block diagram illustrating a system on chip (SoC) according to an embodiment.

FIG. 10 is a block diagram illustrating a system on chip (SoC) 1000 according to an embodiment. The SoC 1000 may be a semiconductor device and may include an integrated circuit according to an embodiment. For example, the SoC 1000 may include at least one of the integrated circuits 10, 10A, 10B, 10C, 10D, 10E illustrated in FIGS. 1, 4, and 8A through 8D, respectively.

The SoC 1000 may be a chip in which complex functional blocks, such as intellectual property (IP), which performs various functions, are implemented, and standard cells according to example embodiments may be included in each functional block, and accordingly, the SoC 1000, which is easy to fabricate, may be obtained.

Referring to FIG. 10, the SoC 1000 may include a modem 1200, a display controller 1300, a memory 1400, an external memory controller 1500, a central processing unit (CPU) 1600, a transaction unit 1700, a power management integrated circuit (PMIC) 1800, and a graphics processing unit (GPU) 1900, and the functional blocks of the SoC 1000 may communicate with each other via a system bus 1100.

The CPU 1600 capable of controlling an overall operation of the SoC 1000 may control operations of the other functional blocks (for example, 1200, 1300, 1400, 1500, 1700, 1800, and 1900). The modem 1200 may demodulate a signal received from the outside of the SoC 1000, or may modulate a signal generated in the SoC 1000 and transmit the modulated signal to the outside. The external memory controller 1500 may control an operation of sending and receiving data to and from an external memory device connected to the SoC 1000. For example, programs and/or data stored in the external memory device may be provided to the CPU 1600 or the GPU 1900 under the control of the external memory controller 1500. The GPU 1900 may execute program instructions related to graphics processing. The GPU 1900 may receive graphic data via the external memory controller 125 and may transmit graphic data processed by the GPU 1900 to the outside of the SoC 1000 via the external memory controller 1500. The transaction unit 1700 may monitor data transaction of each functional block, and the PMIC 1800 may control power supplied to each functional block under the control of the transaction unit 1700. The display controller 1300 may transmit data generated inside the SoC 1000 to a display by controlling the display (or a display device) outside the SoC 1000.

The memory 1400 may include a nonvolatile memory such as electrically erasable programmable read-only memory (ROM) (EEPROM), a flash memory, PRAM, RRAM, nano floating gate memory (NFGM), polymer RAM (PoRAM), MRAM, and FRAM, and a volatile memory such as DRAM, SRAM) mobile DRAM, double data rate (DDR)synchronous DRAM (DDR SDRAM), low power DDR (LPDDR) SDRAM, graphics DDR (GDDR) SDRAM, and rambus DRAM (RDRAM).

As described above, embodiments have been disclosed in the drawings and specification. While the embodiments have been described herein with reference to specific terms, it should be understood that they have been used only for the purpose of describing technical ideas of inventive concepts and not for limiting the scope of inventive concepts as defined in the claims. Therefore, one of ordinary skill in the art would understand that various modifications and equivalent embodiments are possible without departing from the scope of inventive concepts. Accordingly, the true scope of protection of inventive concepts should be determined by the technical idea of the following claims.

What is claimed is:

1. An integrated circuit comprising:
    a standard cell defined by a cell boundary and a plurality of second wirings on a upper layer of the standard cell, the standard cell including,
        a plurality of gate lines spaced apart from each other in a first direction and extending in a second direction perpendicular to the first direction, and
        a plurality of first wirings on a upper layer of the plurality of gate lines, the plurality of first wiring including a clubfoot structure conductive pattern, the clubfoot structure conductive pattern including a first conductive pattern and a second conductive pattern apart from each other,
        each of the first conductive pattern and the second conductive pattern including a first line pattern extending in the first direction and a second line pattern protruding from one end of the first line pattern in a direction perpendicular to the first direction, and
    the plurality of gate lines being spaced apart from each other by a first pitch in the first direction; and
    the plurality of second wirings on the upper layer of the standard cell,
        the plurality of second wirings extending in the second direction,
        the plurality of second wirings being spaced apart from each other by a second pitch in the first direction, the second pitch being less than the first pitch.

2. The integrated circuit of claim 1, wherein at least one second wiring among the plurality of second wirings is aligned with the cell boundary.

3. The integrated circuit of claim 1, wherein the plurality of second wirings are spaced apart from the cell boundary.

4. The integrated circuit of claim 1, wherein a width of the standard cell in the first direction has a value of an even number multiple of the first pitch.

5. The integrated circuit of claim 1, wherein
    the standard cell includes a first active region and a second active region that extend in the first direction and are spaced apart from each other in the second direction, and
    one first wiring extending in the first direction among the plurality of first wirings is arranged in at least one of the first active region or the second active region.

6. The integrated circuit of claim 1, wherein a ratio of the first pitch to the second pitch is about 3:2.

7. The integrated circuit of claim 1, wherein
    the standard cell further includes a plurality of first vias configured to electrically connect the plurality of gate lines to the plurality of first wirings, the second line pattern of the first conductive pattern and the second line pattern of the second conductive pattern are connected to different gate lines among the plurality of gate lines via different first vias among the plurality of first vias, respectively.

8. The integrated circuit of claim 7, wherein the gate line connected to the first conductive pattern and the gate line connected to the second conductive pattern are arranged adjacent to each other.

9. The integrated circuit of claim 1, wherein the standard cell further includes a plurality of second vias configured to connect the plurality of first wirings to the plurality of second wirings,
the first line pattern of the first conductive pattern is connected to one of the plurality of second wirings via one second via among the plurality of second vias, and
the second line pattern of the second conductive pattern is connected to an other second wiring among the plurality of second wirings via an other second via among the plurality of second vias.

10. The integrated circuit of claim 9, wherein the second wiring connected to the first conductive pattern and the second wiring connected to the second conductive pattern are adjacent to each other.

11. The integrated circuit of claim 1, wherein an end of the first conductive pattern in the first direction and an end of the second conductive pattern in the first direction are spaced apart from each other in the first direction.

12. The integrated circuit of claim 1, wherein a distance between the first line pattern of the first conductive pattern and the second line pattern of the second conductive pattern is less than a pitch between a plurality of first wirings excluding the clubfoot structure conductive pattern.

13. An integrated circuit comprising:
a standard cell including,
a first gate line and a second gate line, the first gate line and the second gate line being spaced apart from each other in a first direction and extending in a second direction that is perpendicular to the first direction,
a clubfoot structure conductive pattern including a first conductive pattern and a second conductive pattern symmetrical to each other,
the first conductive pattern on an upper layer of the first gate line and the second conductive pattern on an upper layer of the second gate line,
each of the first conductive pattern and the second conductive pattern including a first line pattern extending in the first direction and a second line pattern protruding in a direction perpendicular to the first direction from one end of the first line pattern,
a plurality of first vias configured to electrically connect the first gate line to the first conductive pattern and to electrically connect the second gate line to the second conductive pattern, and
a plurality of second vias configured to electrically connect to the clubfoot structure conductive pattern; and
a plurality of wirings on an upper layer of the standard cell,
the plurality of wirings being spaced apart from each other in the first direction and extending in the second direction, and
the plurality of wirings being configured to connect to the clubfoot structure conductive pattern through the plurality of second vias.

14. The integrated circuit of claim 13, wherein the standard cell includes a first active region, a second active region, and a clubfoot structure conductive pattern arranged between the first active region and the second active region, and
the first active region and the second active region extend in the first direction and are spaced apart from each other in the second direction.

15. The integrated circuit of claim 13, wherein the first gate line and the second gate line are spaced apart from each other by a first pitch in the first direction,
the plurality of wirings are spaced apart from each other by a second pitch in the first direction, and
a ratio of the first pitch to the second pitch is about 3:2.

16. The integrated circuit of claim 13, wherein the first gate line is aligned with one of the plurality of wirings, and
the second gate line is not aligned with the plurality of wirings.

17. The integrated circuit of claim 13, wherein one of the first line pattern of the first conductive pattern and the first line pattern of the second conductive pattern are connected to one second via among the plurality of second vias.

18. The integrated circuit of claim 13, wherein the second line pattern of the first conductive pattern is connected to one first via among the plurality of first vias, and
the second line pattern of the second conductive pattern is connected to a different one first via among the plurality of first vias.

19. An integrated circuit comprising:
a plurality of standard cells,
the plurality of standard cells including a first standard cell and a second standard cell that each include a plurality of gate lines,
the plurality of gate lines being spaced apart from each other by a first pitch in a first direction and extending in a second direction perpendicular to the first direction,
at least one of the first standard cell and the second standard cell including a clubfoot structure conductive pattern that includes a first conductive pattern and a second conductive pattern,
each of the first conductive pattern and the second conductive pattern including a first line pattern extending in the first direction and a second line pattern protruding in a direction perpendicular to the first direction from one end of the first line pattern; and
a plurality of wirings on an upper layer of the first standard cell and on an upper layer the second standard cell,
the plurality of wiring being spaced apart from each other by a second pitch in the first direction,
the plurality of wirings extending in a second direction perpendicular to the first direction, and
the second pitch being less than the first pitch.

20. The integrated circuit of claim 19, wherein a width of the first standard cell in the first direction and a width of the second standard cell in the first direction, respectively, have values that are even number multiples of the first pitch.

* * * * *